US012334397B2

(12) United States Patent
Chin et al.

(10) Patent No.: US 12,334,397 B2
(45) Date of Patent: Jun. 17, 2025

(54) INTERCONNECT STRUCTURE INCLUDING GRAPHITE AND METHOD FORMING SAME

(71) Applicant: Taiwan Semiconductor Manufacturing Co., Ltd., Hsinchu (TW)

(72) Inventors: Shu-Cheng Chin, Hsinchu (TW); Chih-Yi Chang, New Taipei (TW); Wei Hsiang Chan, Hsinchu (TW); Chih-Chien Chi, Hsinchu (TW); Chi-Feng Lin, Hsinchu (TW); Hung-Wen Su, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 657 days.

(21) Appl. No.: 17/382,001

(22) Filed: Jul. 21, 2021

(65) Prior Publication Data

US 2022/0367266 A1 Nov. 17, 2022

Related U.S. Application Data

(60) Provisional application No. 63/188,187, filed on May 13, 2021.

(51) Int. Cl.
*H01L 21/768* (2006.01)
*H01L 21/3105* (2006.01)
(Continued)

(52) U.S. Cl.
CPC .. *H01L 21/76885* (2013.01); *H01L 21/76832* (2013.01); *H01L 21/76834* (2013.01);
(Continued)

(58) Field of Classification Search
CPC ......... H01L 21/76885; H01L 21/76832; H01L 21/76834; H01L 21/7684; H01L 23/5226;
(Continued)

(56) References Cited

U.S. PATENT DOCUMENTS

| 5,965,296 A | * | 10/1999 | Nishimura | ........ | H01M 10/0525 |
| | | | | | 427/314 |
| 2005/0110145 A1 | * | 5/2005 | Elers | ................. | H01L 21/76844 |
| | | | | | 257/E21.585 |

(Continued)

FOREIGN PATENT DOCUMENTS

| JP | 2015537392 A | 12/2015 |
| JP | 2017168504 A | 9/2017 |

(Continued)

OTHER PUBLICATIONS

IP.com npl Search (Year: 2024).*

(Continued)

*Primary Examiner* — William B Partridge
*Assistant Examiner* — David Paul Sedorook
(74) *Attorney, Agent, or Firm* — Slater Matsil, LLP

(57) ABSTRACT

A method includes forming a first conductive feature, depositing a graphite layer over the first conductive feature, patterning the graphite layer to form a graphite conductive feature, depositing a dielectric spacer layer on the graphite layer, depositing a first dielectric layer over the dielectric spacer layer, planarizing the first dielectric layer, forming a second dielectric layer over the first dielectric layer, and forming a second conductive feature in the second dielectric layer. The second conductive feature is over and electrically connected to the graphite conductive feature.

20 Claims, 23 Drawing Sheets

(51) Int. Cl.
*H01L 21/3213* (2006.01)
*H01L 23/522* (2006.01)
*H01L 23/532* (2006.01)

(52) U.S. Cl.
CPC ...... *H01L 21/7684* (2013.01); *H01L 23/5226* (2013.01); *H01L 23/53276* (2013.01); *H01L 21/31053* (2013.01); *H01L 21/32136* (2013.01); *H01L 23/53238* (2013.01)

(58) Field of Classification Search
CPC ......... H01L 23/53276; H01L 21/31053; H01L 21/32136; H01L 23/53238
See application file for complete search history.

(56) References Cited

U.S. PATENT DOCUMENTS

| | | |
|---|---|---|
| 2005/0142844 A1 | 6/2005 | Ahn |
| 2006/0170058 A1* | 8/2006 | Chiang ............. H01L 21/02266 |
| | | 257/E21.507 |
| 2008/0073748 A1* | 3/2008 | Bielefeld .......... H01L 23/53295 |
| | | 257/E23.152 |
| 2013/0015583 A1* | 1/2013 | Hoeckele ........... H10N 70/8845 |
| | | 438/618 |
| 2014/0167268 A1 | 6/2014 | Bao et al. |
| 2015/0118837 A1* | 4/2015 | Shieh .................. H01L 21/7684 |
| | | 438/618 |
| 2016/0093551 A1* | 3/2016 | Venugopal .......... H01L 23/5226 |
| | | 257/29 |
| 2016/0093668 A1* | 3/2016 | Lu ........................ H01L 23/528 |
| | | 257/421 |
| 2017/0301621 A1* | 10/2017 | Briggs ................ H01L 21/7682 |
| 2018/0138076 A1* | 5/2018 | Yang .................. H01L 21/7682 |
| 2018/0350913 A1* | 12/2018 | Yang ................ H01L 21/76879 |
| 2020/0083093 A1 | 3/2020 | Liu et al. |
| 2020/0161298 A1* | 5/2020 | Lilak ............... H01L 21/823431 |
| 2022/0285686 A1* | 9/2022 | Kim ..................... H01M 4/362 |

FOREIGN PATENT DOCUMENTS

| | | |
|---|---|---|
| KR | 960039286 A | 11/1996 |
| KR | 20050069121 A | 7/2005 |

OTHER PUBLICATIONS

Lu, et al., "Patterning of highly oriented pyrolytic graphite by oxygen plasma etching," Applied Physics Letters, vol. 75, No. 2, Jul. 12, 1999, 3 pages.

Wikipedia, "Graphen," https://de.wikipedia.org/w/index.php?title=Graphen&oldid=207843820, Apr. 19, 2023, 16 pages.

An, et al., "Characteristics of an Amorphous Carbon Layer as a Diffusion Barrier for an Advanced Copper Interconnect," Applied Materials & Interfaces, vol. 12, Jan. 15, 2022, pp. 3104-3113.

* cited by examiner

INTERCONNECT STRUCTURE INCLUDING GRAPHITE AND METHOD FORMING SAME

PRIORITY CLAIM AND CROSS-REFERENCE

This application claims the benefit of the following provisionally filed U.S. patent application: Application No. 63/188,187, filed on May 13, 2021, and entitled "Single Damascene Graphite Interconnect;" which application is hereby incorporated herein by reference.

BACKGROUND

Interconnect structure are used in integrated circuits for interconnecting devices such as transistors, diodes, capacitors, etc., in order to form functional circuits. Conventional interconnect structures may include damascene structures. A damascene structure typically includes a barrier layer and a copper region on the barrier layer, and hence the barrier layer is formed on the opposite sides of the copper region.

With the increasing reduction of the widths of the interconnect structures, the thickness of the barrier layers is becoming an increasingly greater portion of the interconnect structure. For example, when a metal line has a width smaller than 10 nm, the thickness of the barrier/liner layer still needs to be about 30 Å for the barrier layer to be effective in preventing copper from diffusing-through. This means about 60 Å is used by the barrier layer since the barrier/liner layer extends on the opposite sides of the copper region. This leaves less than 40 Å for forming the copper region. The resistivity of copper, however, increases significantly when the dimension of copper is smaller than 10 nm. The resistance value of the metal line thus may not be able to meet the requirement of the interconnect structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
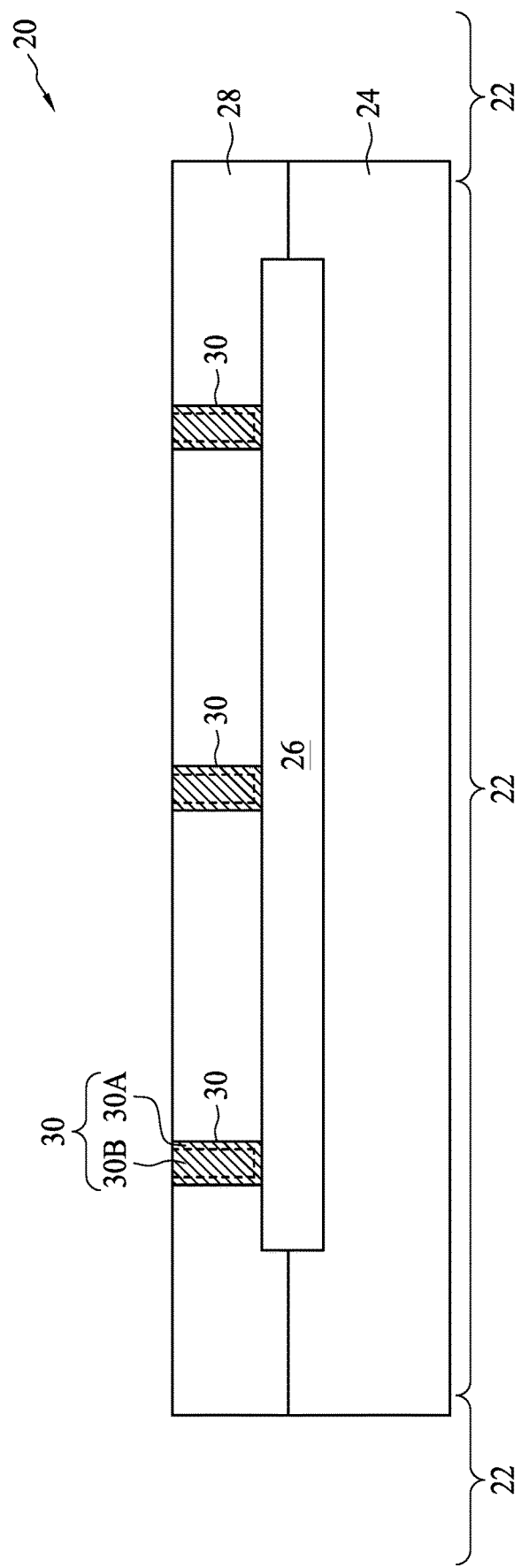
FIGS. 1-12 illustrate the cross-sectional views of intermediate stages in the formation of an interconnect structure comprising graphite in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure comprising graphite conductive features and the method of forming the same are provided. In accordance with some embodiments of the present disclosure, a graphite layer is deposited. The graphite layer is patterned to form conductive features such as conductive lines, conductive vias, conductive plugs, or the like. A spacer layer may be deposited on the graphite conductive features to prevent peeling from occurring. By using the graphite as the conductive material for forming the interconnect structure, no diffusion barrier layer is needed. Accordingly, the lateral dimensions (such as the widths) of the resulting conductive features may be reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 12 illustrate the cross-sectional views of intermediate stages in the formation of a graphite-containing interconnect structure in accordance with some embodiments of the present disclosure. The corresponding processes are also reflected schematically in the process flow shown in FIG. 23.

FIG. 1 illustrates a cross-sectional view of package component 20. In accordance with some embodiments of the present disclosure, package component 20 is a device wafer including active devices and possibly passive devices, which are represented by the illustrated integrated circuit devices 26. Device wafer 20 may include a plurality of dies 22 therein, with one of dies 22 illustrated. In accordance with alternative embodiments of the present disclosure, package component 20 is an interposer wafer, which may or may not include active devices and/or passive devices. In subsequent discussion, a device wafer is discussed as an example of package component 20. The embodiments of the present disclosure may also be applied to other types of package components such as interposer wafers, package substrates, packages, etc.

In accordance with some embodiments of the present disclosure, wafer 20 includes semiconductor substrate 24 and the features formed at a top surface of semiconductor substrate 24. Semiconductor substrate 24 may be formed of crystalline silicon, crystalline germanium, silicon germanium, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may be (or may not be) formed to extend into semiconductor substrate 24, wherein the through-vias are used to electrically inter-couple the features on opposite sides of wafer 20.

In accordance with some embodiments of the present disclosure, integrated circuit devices 26 are formed at the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated in FIG. 1. FIGS. 17 through 22 illustrate the schematic views of some example transistors in accordance with some embodiments, which include Fin Field-Effect Transistors (FinFETs), nano-sheet transistors, and nanowire transistors, or the like. In accordance with alternative embodiments, wafer 20 is used for forming interposers, and substrate 24 may be a semiconductor substrate or a dielectric substrate.

Dielectric layer 28 is formed over integrated circuit devices 26. In accordance with some embodiments, dielectric layer 28 is an Inter-Layer Dielectric (ILD), in which contact plugs are formed. The corresponding material may be or may comprise silicon oxide, phospho-silicate glass (PSG), borosilicate glass (BSG), boron-doped phospho-silicate glass (BPSG), fluorine-doped silicate glass (FSG), or the like. In accordance with alternative embodiments, dielectric layer 28 is an Inter-Metal Dielectric (IMD), in which metal lines (may be or may include vias) are formed. The corresponding dielectric material may comprise a carbon-containing low-k dielectric material, HSQ, MSQ, or the like. Dielectric layer 28 may be formed using spin coating, Flowable Chemical Vapor Deposition (FCVD), Plasma Enhanced Chemical Vapor Deposition (PECVD), Low Pressure Chemical Vapor Deposition (LPCVD), or the like.

Figure 23:
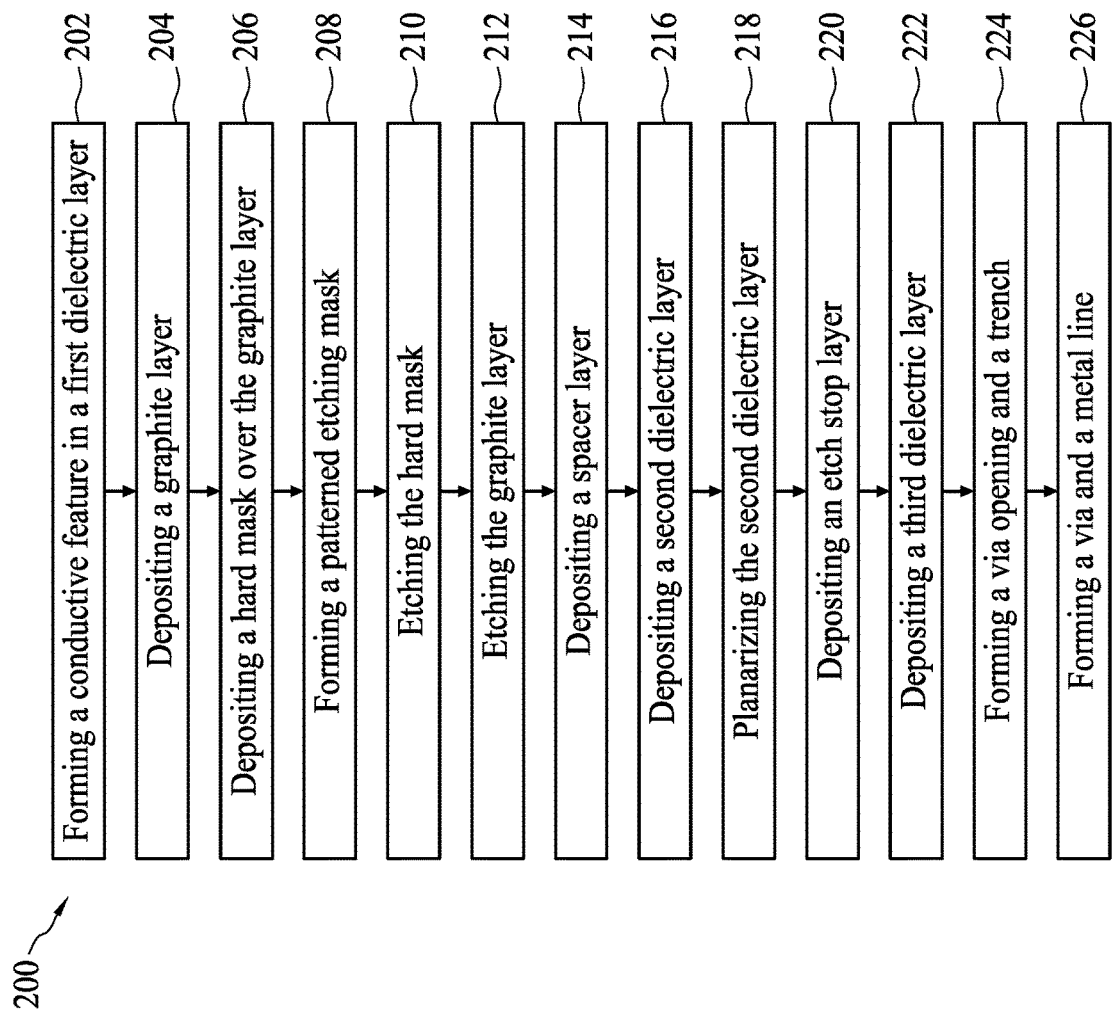
FIG. 23 illustrates a process flow for forming an interconnect structure comprising graphite in accordance with some embodiments.

Conductive features 30 are formed in dielectric layer 28, and are used to electrically connect integrated circuit devices 26 to overlying metal lines and vias. The respective process is illustrated as process 202 in the process flow 200 as shown in FIG. 23. In accordance with some embodiments in which dielectric layer 28 is an ILD, conductive features 30 are contact plugs, are hence may be referred to as contact plugs 30 hereinafter. In accordance with alternative embodiments, dielectric layer 28 may be IMDs, and conductive features 30 may be vias, conductive lines, or the like. In accordance with yet alternative embodiments, conductive features 30 are the gate electrodes of transistors.

In accordance with some embodiments, each of conductive features 30 comprises barrier 30A and conductive material 30B on barriers 30A. Barrier 30A may be formed of a conductive material selected from titanium, tantalum, titanium nitride, tantalum nitride, alloys therefore, and/or multi-layers thereof. The conductive material may include copper, cobalt, tungsten, ruthenium, or the like, or alloys thereof. In accordance with alternative embodiments, conductive features 30 are barrier-less, and are formed of a homogeneous material, which may comprise cobalt, tungsten, ruthenium, or the like, or alloys thereof. The lateral dimension of conductive features 30 may be smaller than about 20 nm, and may be in the range between about 6 nm and about 15 nm.

The formation of conductive features 30 may include forming contact openings in dielectric layer 28, filling a conductive material(s) into the contact openings, and performing a planarization process such as a Chemical Mechanical Polish (CMP) process or a mechanical grinding process to level the top surfaces of conductive features 30 with the top surface of dielectric layer 28.

Figure 12:
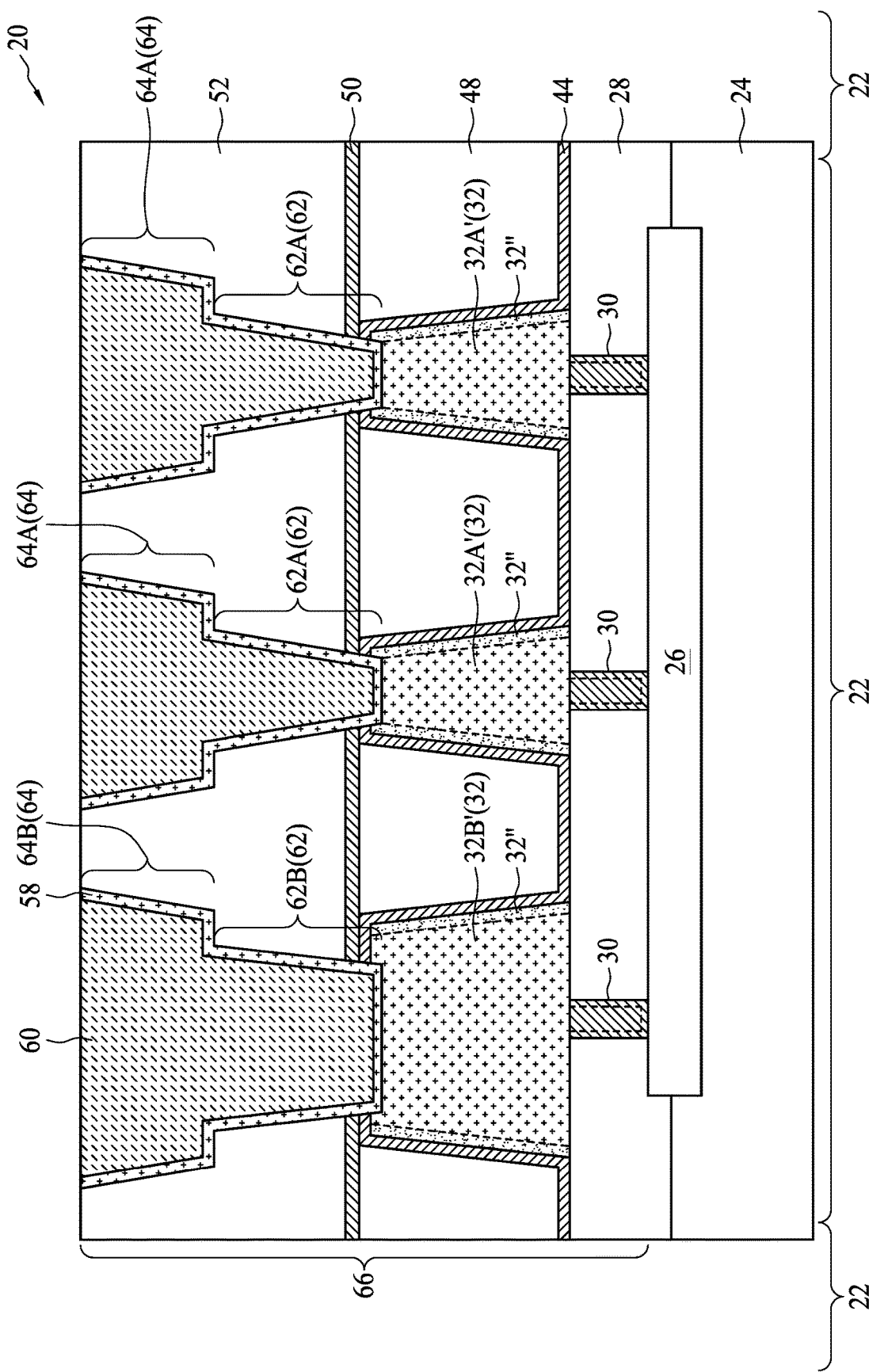
Figure 16:
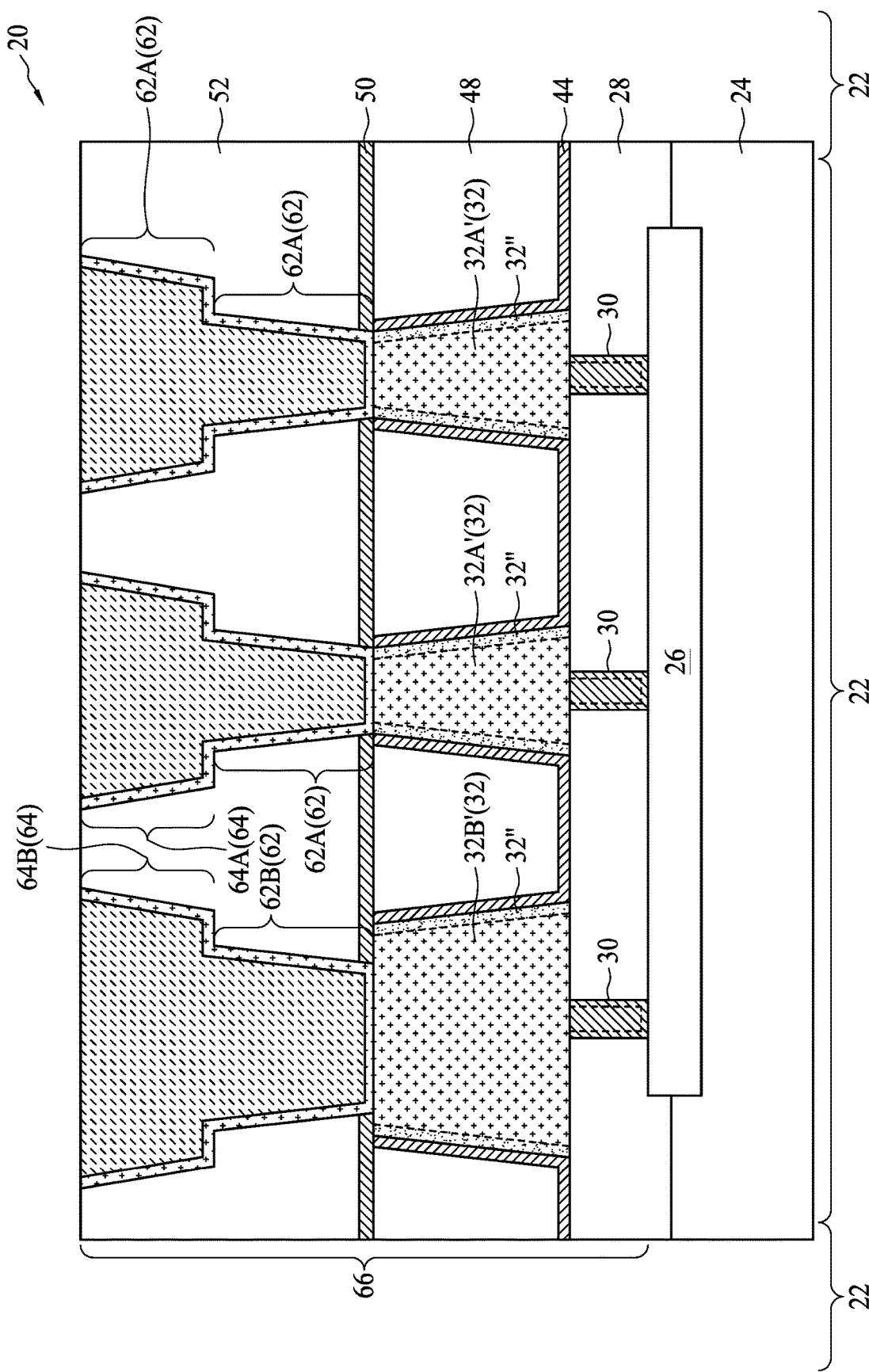

In accordance with alternative embodiments, conductive features 30 are formed of graphite, and hence have the structure of graphite conductive features 32A' as shown in FIGS. 12 and 16. The formation processes of conductive features 30 and the corresponding dielectric layer 28 may be essentially the same as shown in FIGS. 2 through 9, or FIGS. 2-8 and 14. The corresponding dielectric layer 28 thus may include a dielectric spacer layer and an etch stop layer, as will be discussed in subsequent paragraphs.

Figure 2:
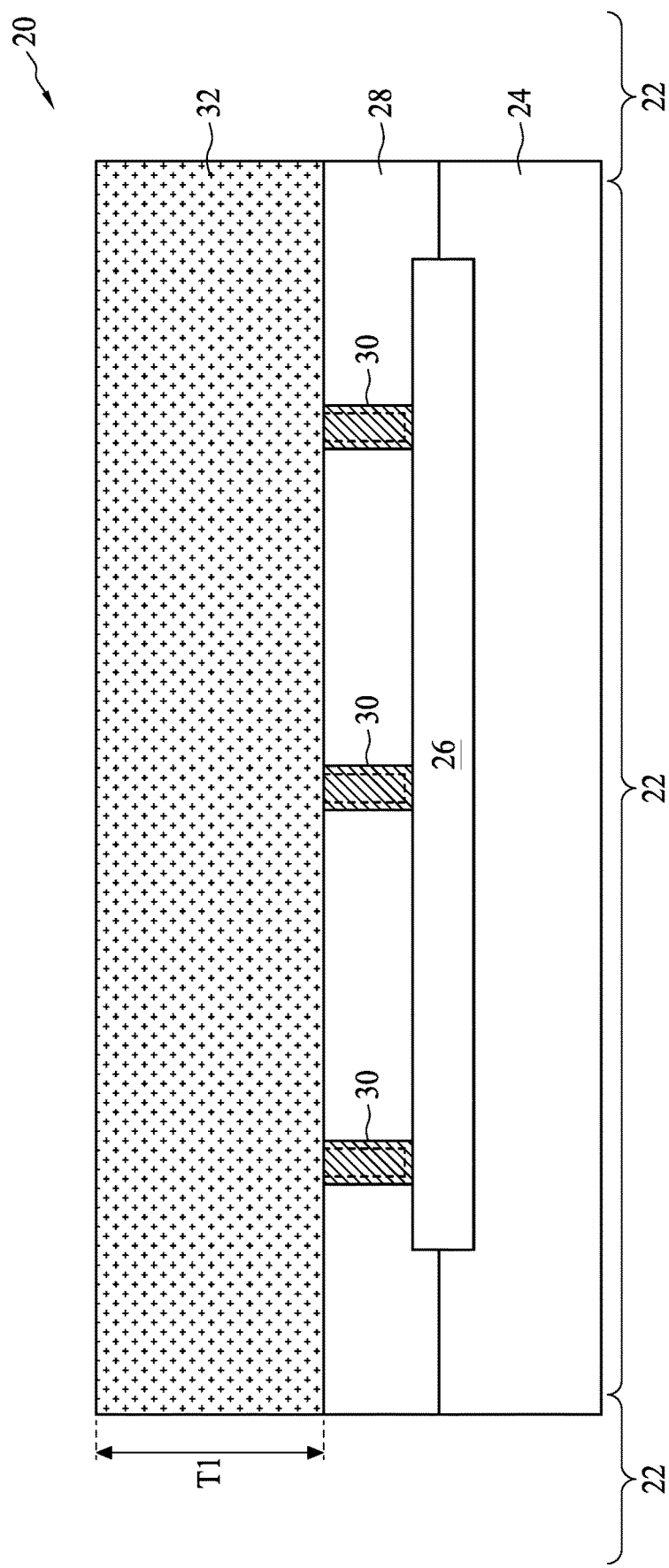

Referring to FIG. 2, graphite layer 32 is deposited. The respective process is illustrated as process 204 in the process flow 200 as shown in FIG. 23. In accordance with some embodiments, the deposition of graphite layer 32 is performed through Plasma Enhance Chemical Vapor Deposition (PECVD), while other methods such as CVD, ALD, pyrolytic, or the like may also be used. The precursor may comprise a carbon-containing gas such as $CH_4$, $C_2H_2$, or the like, carbon hydrides, or combinations thereof. Other gases such as $H_2$, Ar, or the like may also be added. During the deposition process, the temperature of wafer 20 may be in the range between about 200° C. and about 600° C. In the deposition process, the flow rate of the carbon-containing gas may be in the range between about 100 sccm and about 500 sccm. The flow rate of hydrogen gas ($H_2$, if used) may be in the range between about 1,000 sccm and about 6,000 sccm. The thickness T1 of graphite layer 32 may be in the range between about 15 nm and about 30 nm. As a result of the deposition process, a plurality of graphene layers are formed, each being an atomic layer of carbon arranged in a hexagonal or honeycomb lattice. The plurality of graphene layers collectively form graphite layer 32.

Figure 3:
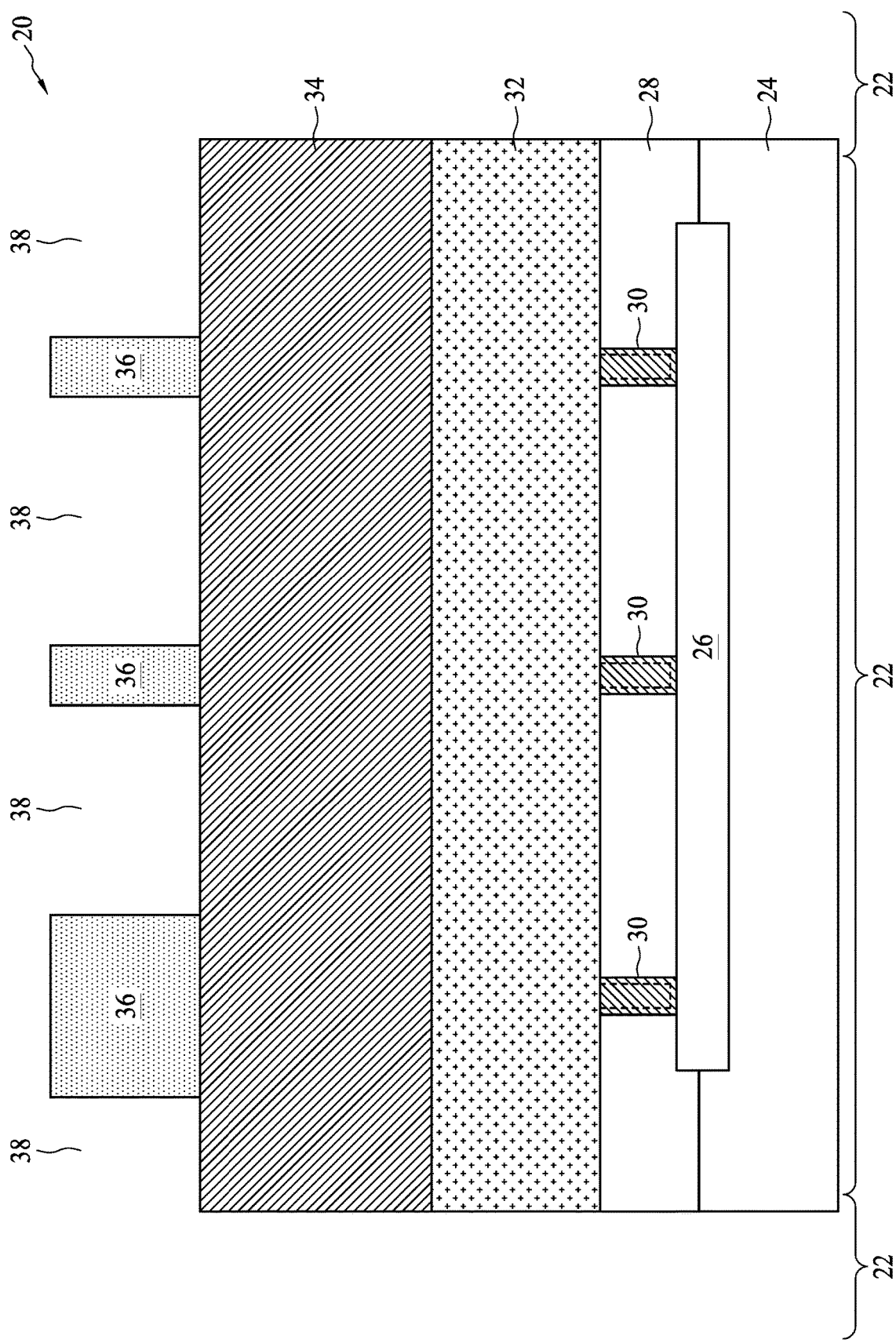

Referring to FIG. 3, hard mask 34 is deposited on graphite layer 32. The respective process is illustrated as process 206 in the process flow 200 as shown in FIG. 23. In accordance with some embodiments, hard mask 34 comprises silicon nitride, silicon oxide, silicon oxynitride, or the like, or combinations thereof. Next, patterned etching mask 36 is formed over hard mask 34, and is patterned. The respective process is illustrated as process 208 in the process flow 200 as shown in FIG. 23. Openings 38 are thus formed in etching mask 36. In accordance with some embodiments, etching mask 36 comprises a single photo resist layer. In accordance with alternative embodiments, etching mask 36 may have a dual-layer structure, a tri-layer structure or the like.

Figure 4:
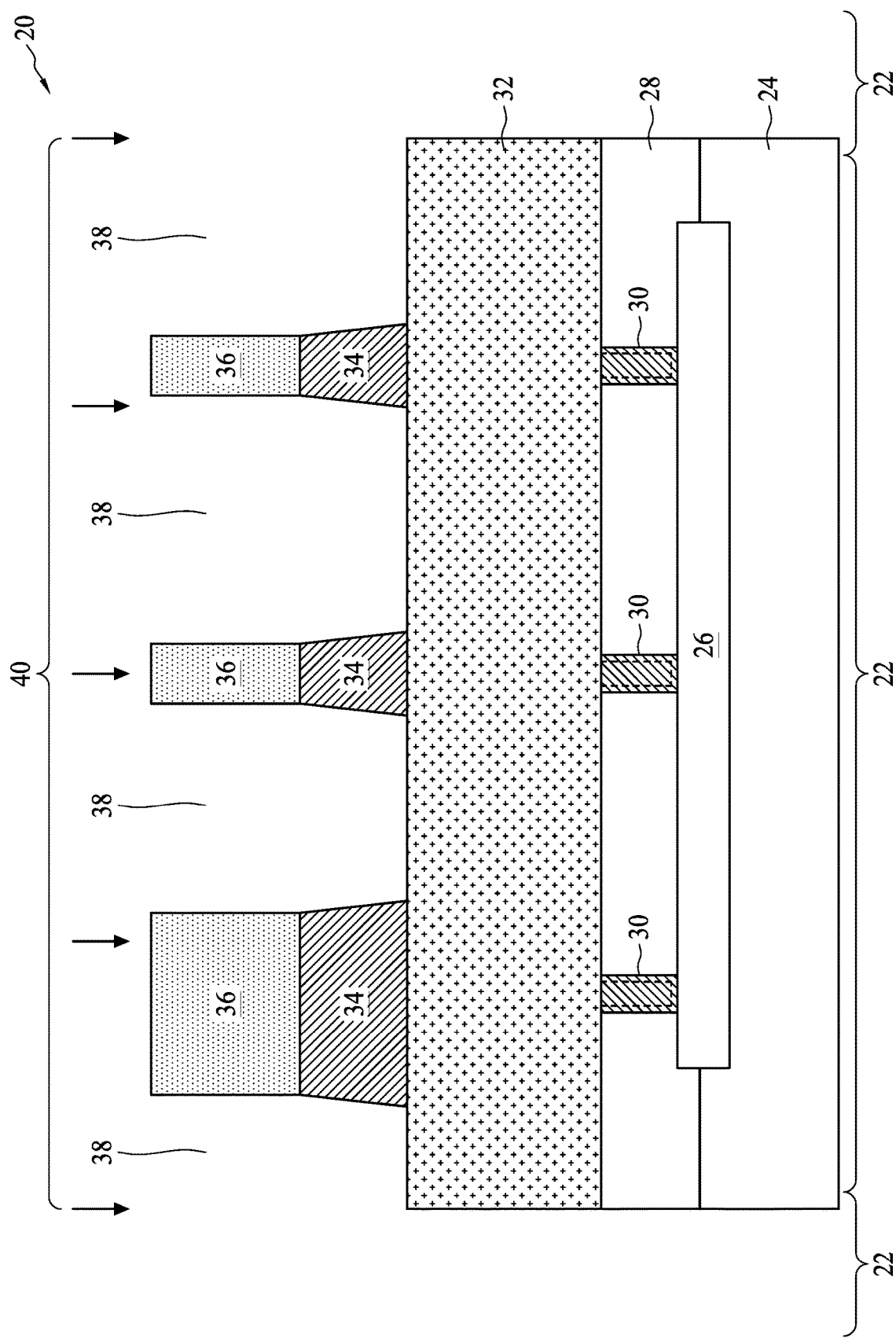

Next, referring to FIG. 4, etching process 40 is performed to pattern hard mask 34. The respective process is illustrated as process 210 in the process flow 200 as shown in FIG. 23. Openings 38 thus extend into hard mask 34, and graphite layer 32 is exposed. The etching process 40 is anisotropic.

The etching gas is selected according to the material of hard mask 36, etching mask 34, and graphite layer 32. For example, oxygen ($O_2$), which etches photo resist and graphite, is not used. When hard mask 34 comprises silicon nitride, the etching gas may include a fluorine-containing gas such as $CF_4$, $NF_3$, $SF_6$, $CHF_3$, or combinations thereof. Other gases such as $N_2$, $H_2$, Ar, and the like, may also be added. When hard mask 34 comprises silicon oxide, the etching gas may include the mixture of $NF_3$ and $NH_3$, or the mixture of HF and $NH_3$.

Figure 5:
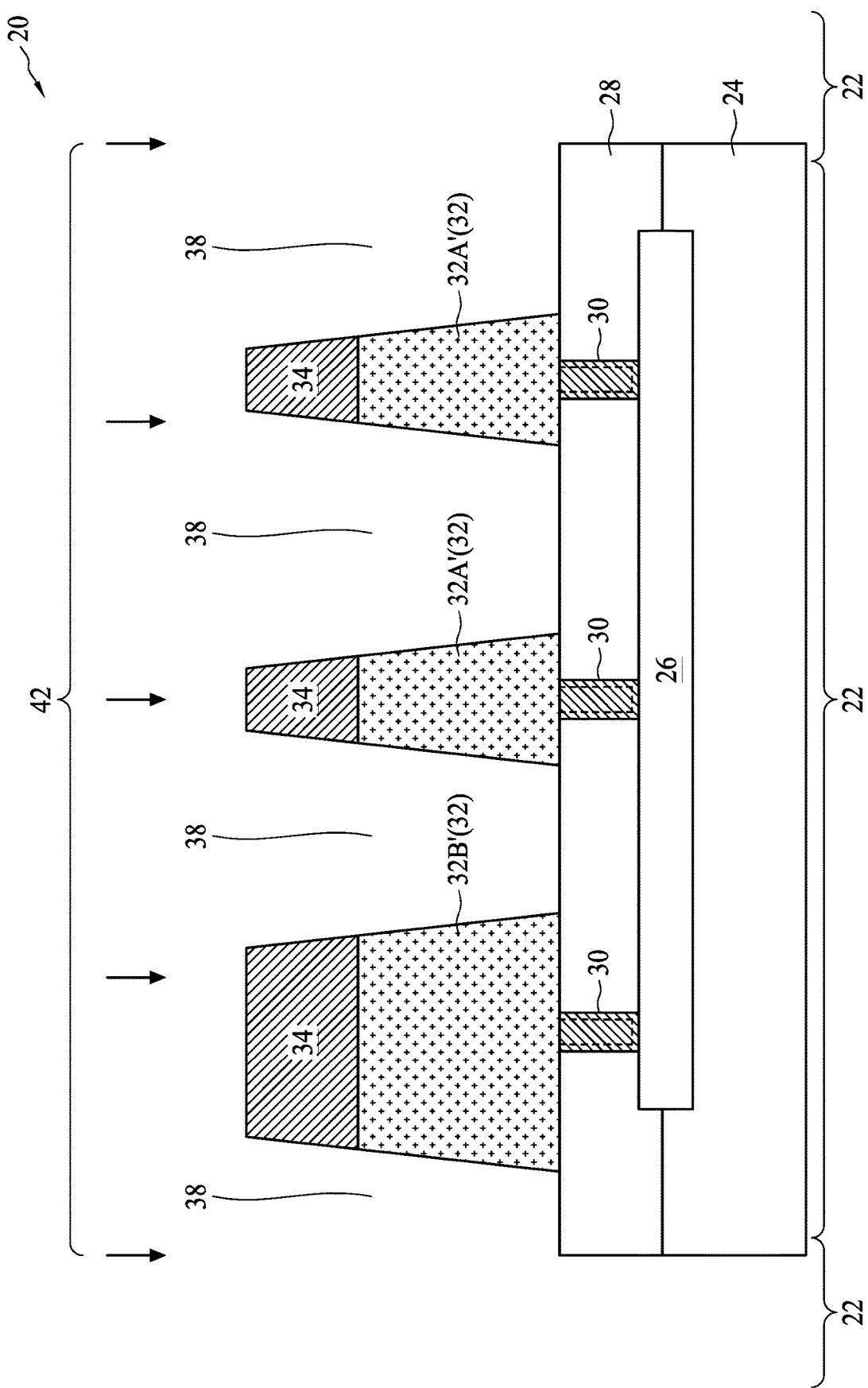

Next, referring to FIG. 5, etching process 42 is performed to etch graphite layer 32, so that a plurality of graphite features 32' are formed. The respective process is illustrated as process 212 in the process flow 200 as shown in FIG. 23. Graphite features 32' may include graphite conductive features 32A', which is used for electrical connection, and graphite seal ring 32B'. For example, graphite conductive features 32A' may be electrically connected to integrated circuit devices 26 through conductive features 30. The etching may be performed through Reactive Ion Etching (RIE). Graphite seal ring 32B' is formed close to the peripheral of device dies 22. For example, after the subsequent singulation process for cutting dies 22 apart from wafer 20, graphite seal ring 32B' may include four portions, each parallel to and adjacent to the respective nearby edge of the corresponding die 22. The portions of graphite seal ring 32B' adjacent to the edges of the corresponding die 22 are interconnected to form a full ring. The seal ring has the function of preventing detrimental substances such as moisture from penetrating from external environment into the inner region of die 22. Seal ring 32B' may be electrically grounded or may be electrically floating in the final structure, for example, after device die is singulated, and when the device die is powered on. Graphite conductive features 32A' may be conductive lines that are elongated. Alternatively, graphite conductive features 32A' may form conductive pads, vias, contact plugs, or the like, which may be elongated or non-elongated.

The etching process 42 is anisotropic, with plasma being generated from the etching gas to etch graphite layer 32. In accordance with some embodiments, the etching gas has the function of consuming etching mask 36, and at the same time etching graphite layer 32. For example, the etching gas may comprises oxygen ($O_2$), which may ash photo resist and at the same time etch graphite layer 32. Other gases that can etch carbon such as Ar, $CO_2$, or the like, may be also be used. During the etching process 42, etching mask 36 may be fully consumed, and the underlying hard mask 34 starts functioning as the etching mask. The exposed graphite layer 32 is etched, and openings 38 extend to the underlying dielectric layer 28. Openings 38 separate the remaining portions of graphite layer 32 as discrete features such as conductive features 32'A and graphite seal ring 32B'. In accordance with alternative embodiments, etching mask 36 is removed first without etching graphite layer 32, and then hard mask 34 is used as an etching mask to etch graphite layer 32. After the etching of graphite layer 32, hard mask 34 is removed.

Figure 6:
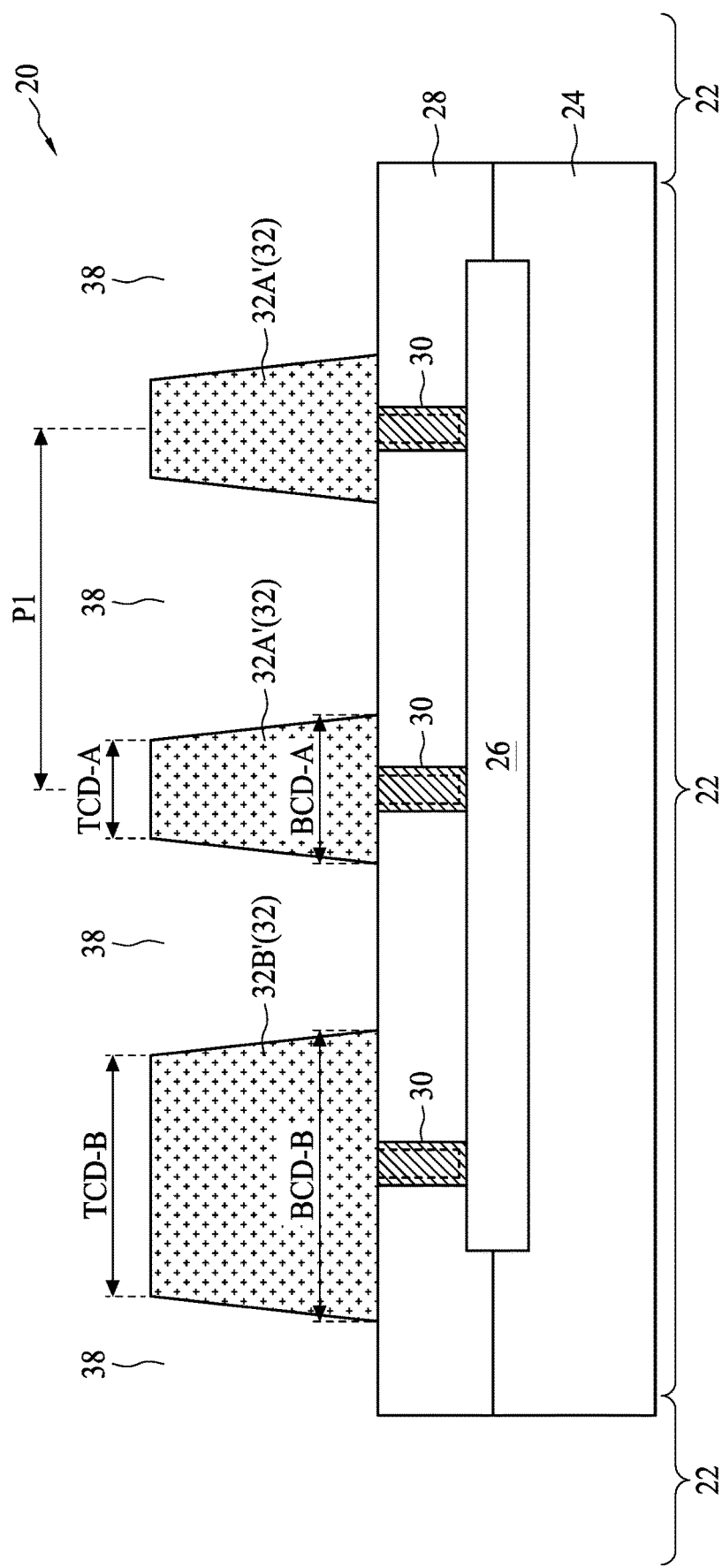

FIG. 6 illustrates a structure after the removal of hard mask 34. In accordance with some embodiments, the pitch P1 of graphite conductive features 32A' may be smaller than about 25 nm. The top width TCD-A of graphite conductive features 32A' may be smaller than about 15 nm or smaller than about 12 nm. The top width TCD-A may also be in the range between about 8 nm and about 11 nm. The bottom width BCD-A of graphite conductive features 32A' is greater than the respective top width TCD-A, and may be smaller than about 16 nm or smaller than about 13 nm. The bottom width BCD-A may also be in the range between about 8.5 nm and about 12 nm. The top width TCD-B of graphite seal ring 32B' may be smaller than about 200 nm or smaller than about 180 nm. The top width TCD-B may also be in the range between about 100 nm and about 180 nm. The bottom width BCD-B of graphite seal ring 32B' is greater than the respective top width TCD-B, and may be smaller than about 200 nm or smaller than about 180 nm. The bottom width BCD-B may also be in the range between about 100 nm and about 180 nm, with the bottom width BCD-B slightly greater than top width TCD-B, for example, with the difference (BCD-B−TCD-B) being in the range between about 0.5 nm and about 2 nm.

Figure 7:
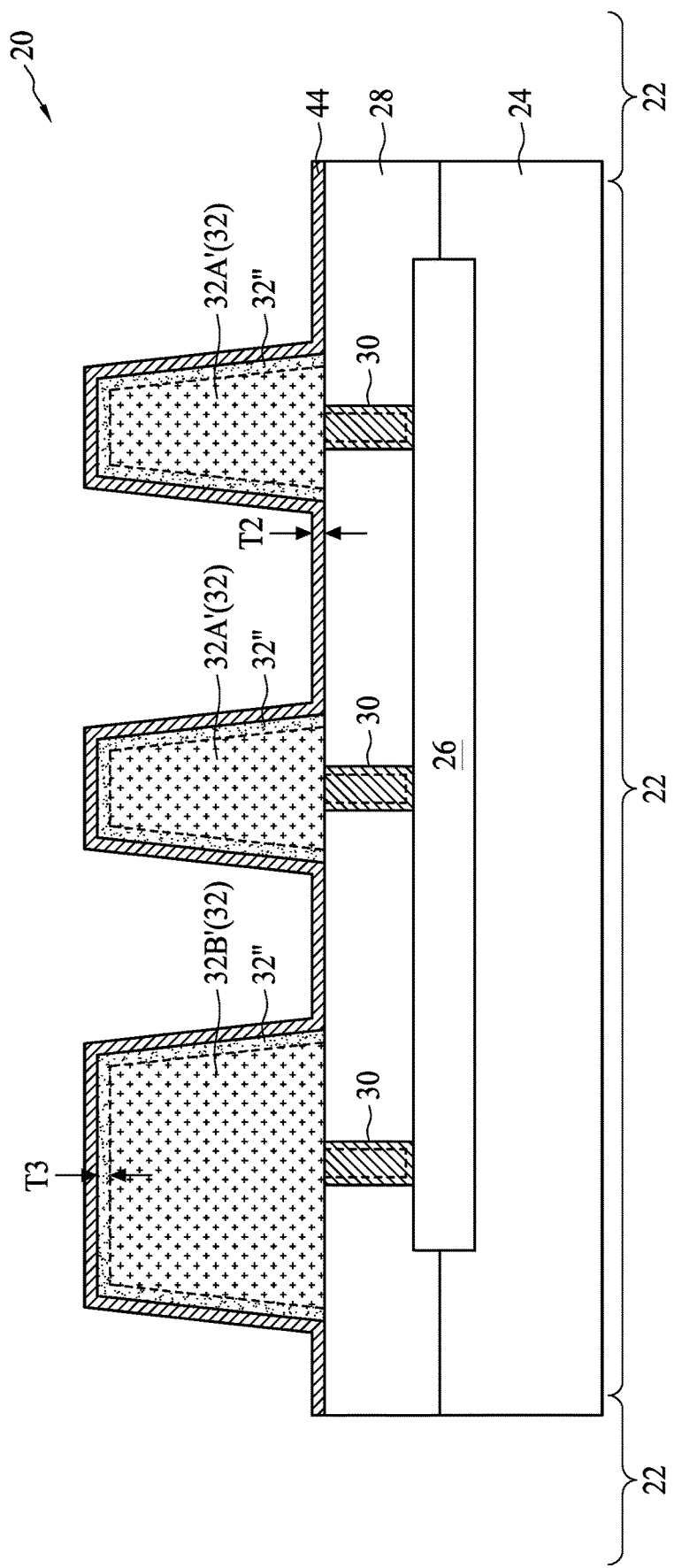

Since the graphene layers in graphite layer 32 are subject to peeling from each other, dielectric spacer layer 44 may be deposited on, and encircles each of, graphite conductive features 32A' and graphite seal ring 32B', as shown in FIG. 7. The respective process is illustrated as process 214 in the process flow 200 as shown in FIG. 23. Dielectric spacer layer 44 may be a conformal layer, which may be deposited using a conformal deposition process such as Atomic Layer Deposition (ALD), Chemical Vapor Deposition (CVD), or the like. The material of dielectric spacer layer 44 may include silicon nitride, silicon oxide, silicon carbide, silicon oxynitride, silicon oxycarbide, or the like, combinations thereof, and/or multi-layers thereof. The thickness T2 of dielectric spacer layer 44 is selected as being not too thin and not too thick. If dielectric spacer layer 44 is too thin, it may not adequately prevent the peeling between graphene layers. Conversely, if dielectric spacer layer 44 is too thick, the spacing between neighboring graphite conductive features 32A' may have to be adversely increased to accommodate the thick spacer layer 44. In accordance with some embodiments, thickness T2 of dielectric spacer layer 44 may be in the range between about 10 Å and about 30 Å.

In above-discussed processes, graphite conductive features 32A' and graphite seal ring 32B' may be exposed to various adverse environment such as the chemicals and plasma used in preceding etching processes and the plasma used in the deposition of dielectric spacer layer 44. As a result, the surface layers 32" of graphite conductive features 32A' and graphite seal ring 32B' may subject to change in structure and composition. For example, the original crystalline surface layer may be converted as an amorphous carbon layer. Furthermore, impurities such as oxygen, fluorine, or the like, may be doped into surface layer 32". Surface layer 32" may also include some oxides. The inner portions of graphite conductive features 32A' and graphite seal ring 32B', on the other hand, are not changed. In accordance with some embodiments, the amorphous surface layer is formed due to the loss of the crystalline structure in the graphite, and hence the resulting amorphous layer is mainly carbon, for example, having a carbon percentage greater than about 80 percent and about 95 percent.

In accordance with some embodiments, the surface layer 32" form interfacial layers with dielectric spacer layer 44 to form an interfacial layer (not shown) in between. The interfacial layer includes the material of dielectric spacer layer 44 and may further include carbon and oxygen, and may or may not include fluorine. Depending on the composition and the structure, surface layer 32" may be electrically conductive or may be electrically insulating. Surface layer 32" may also be electrically conductive, but having an electrical conductivity value lower than the electrical conductivity value of the inner crystalline portion. In subsequent discussion, surface layer 32" may be considered as a converted part of the graphite layer, or may be considered as a separate layer on the graphite layer.

As a comparison, the inner portions of graphite conductive features 32A' and graphite seal ring 32B' have a crystalline structure, and are free from the impurities. For example, the impurity concentration in the inner portion (such as the center of the corresponding graphite conductive features 32A' and graphite seal ring 32B') may be equal to zero, or alternatively, not equal to zero, but less than 10 percent or 1 percent of the impurity concentration in surface layer 32". In accordance with some embodiment, thickness T3 of the surface layer 32" may be in the range between about 3 Å and about 15 Å.

In accordance with alternative embodiments, dielectric spacer layer 44 is not formed. Accordingly, the subsequently formed dielectric layer 48 (FIG. 8) will be in contact with the top surfaces and the sidewalls of graphite conductive features 32A' and graphite seal ring 32B'. In accordance with some embodiments, surface layer 32" forms an interfacial layer with dielectric layer 48 to form an interfacial layer in between. The interfacial layer accordingly includes the material of dielectric layer 48, carbon, and oxygen, and may or may not include fluorine.

Figure 8:
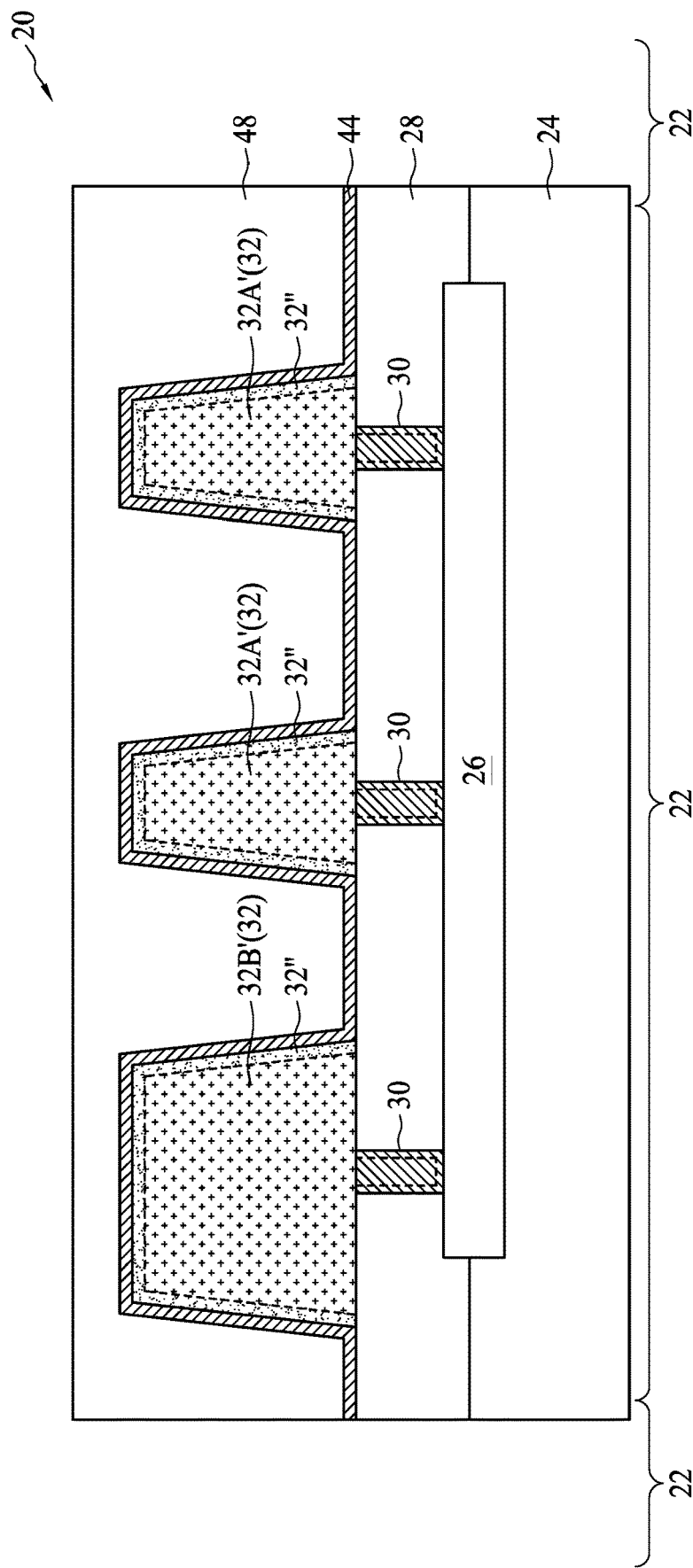

In accordance with some embodiments, surface layer 32" that are amorphous is left unremoved, as shown in FIG. 8. In accordance with alternative embodiments, surface layer 32" that are amorphous are removed through a plasma treatment, wherein hydrogen ($H_2$) may be used as the process. As a result, the crystalline inner portions of graphite conductive features 32A' and graphite seal ring 32B' are in contact with dielectric spacer layer 44, or in contact with dielectric layer 48 (FIG. 8) if dielectric spacer layer 44 is not formed.

Referring to FIG. 8, dielectric layer 48 is deposited over dielectric spacer layer 44. The respective process is illustrated as process 216 in the process flow 200 as shown in FIG. 23. In accordance with some embodiments, dielectric layer 48 is also an ILD layer. Accordingly, dielectric layer 48 may comprise PSG, BSG, BPSG, FSG, silicon oxide, or the like. Dielectric layer 48 may be formed using spin coating, Flowable Chemical Vapor Deposition (FCVD), PECVD, Low Pressure Chemical Vapor Deposition (LPCVD), or the like.

In accordance with alternative embodiments, dielectric layer 48 is an IMD layer for forming metal lines and/or vias. In accordance with some embodiments of the present disclosure, dielectric layer 48 is formed of or comprises a low-k dielectric material having a dielectric constant (k value) lower than 3.8, and the dielectric constant may also be lower than about 3.0 such as between about 2.5 and 3.0. Dielectric layer 48 may comprise a carbon-containing low-k dielectric material, HSQ, MSQ, or the like. In accordance with some embodiments, the formation of dielectric layer 48 includes depositing a porogen-containing dielectric material, and then performing a curing process to drive out the porogen, and hence the remaining dielectric layer 48 is porous.

Figure 9:
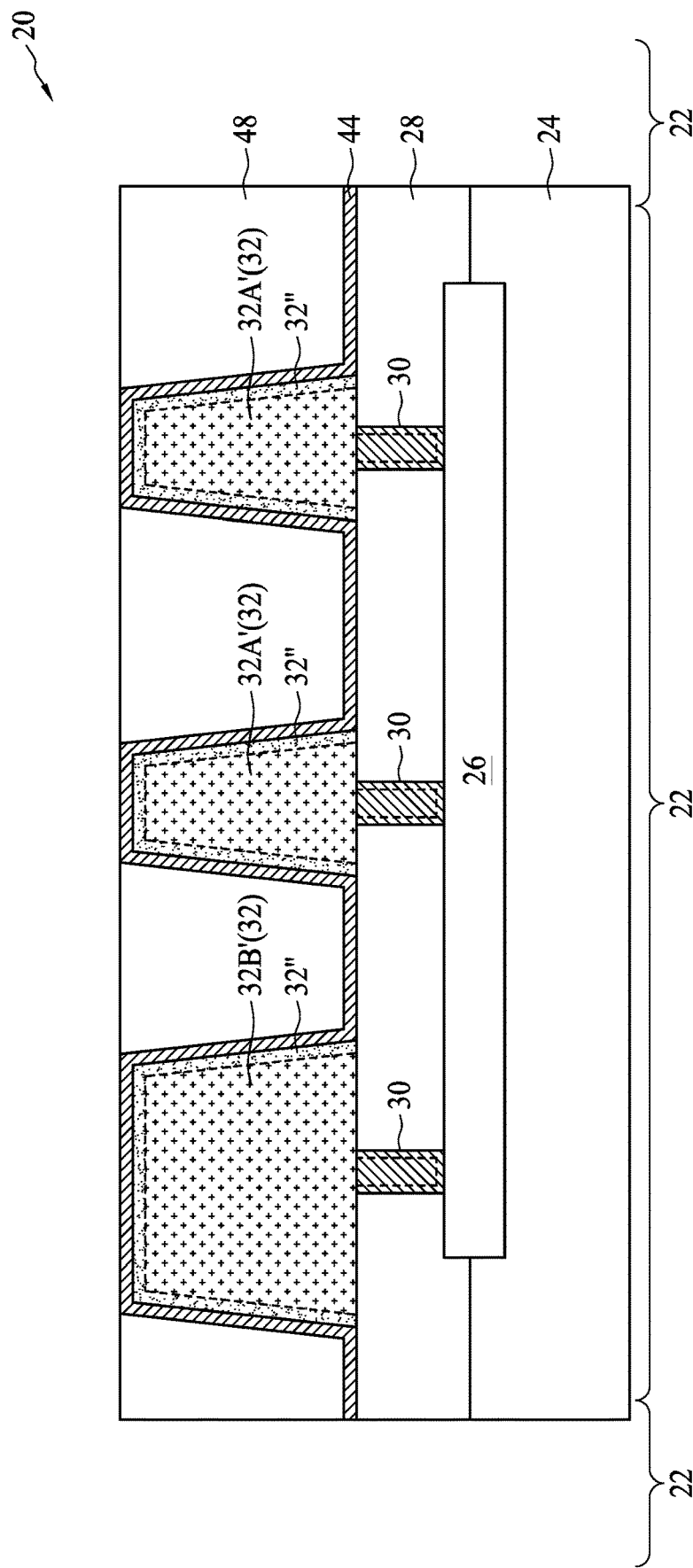

Referring to FIG. 9, a planarization process such as a Chemical Mechanical Polish (CMP) process or a mechanical grinding process is performed. The respective process is illustrated as process 218 in the process flow 200 as shown in FIG. 23. The planarization process may be performed using dielectric spacer layer 44 as a polish stop layer. Accordingly, the top surface of a horizontal portion of dielectric spacer layer 44 is revealed, and the top surface of dielectric spacer layer 44 is coplanar with the top surface of dielectric layer 48.

Figure 10:
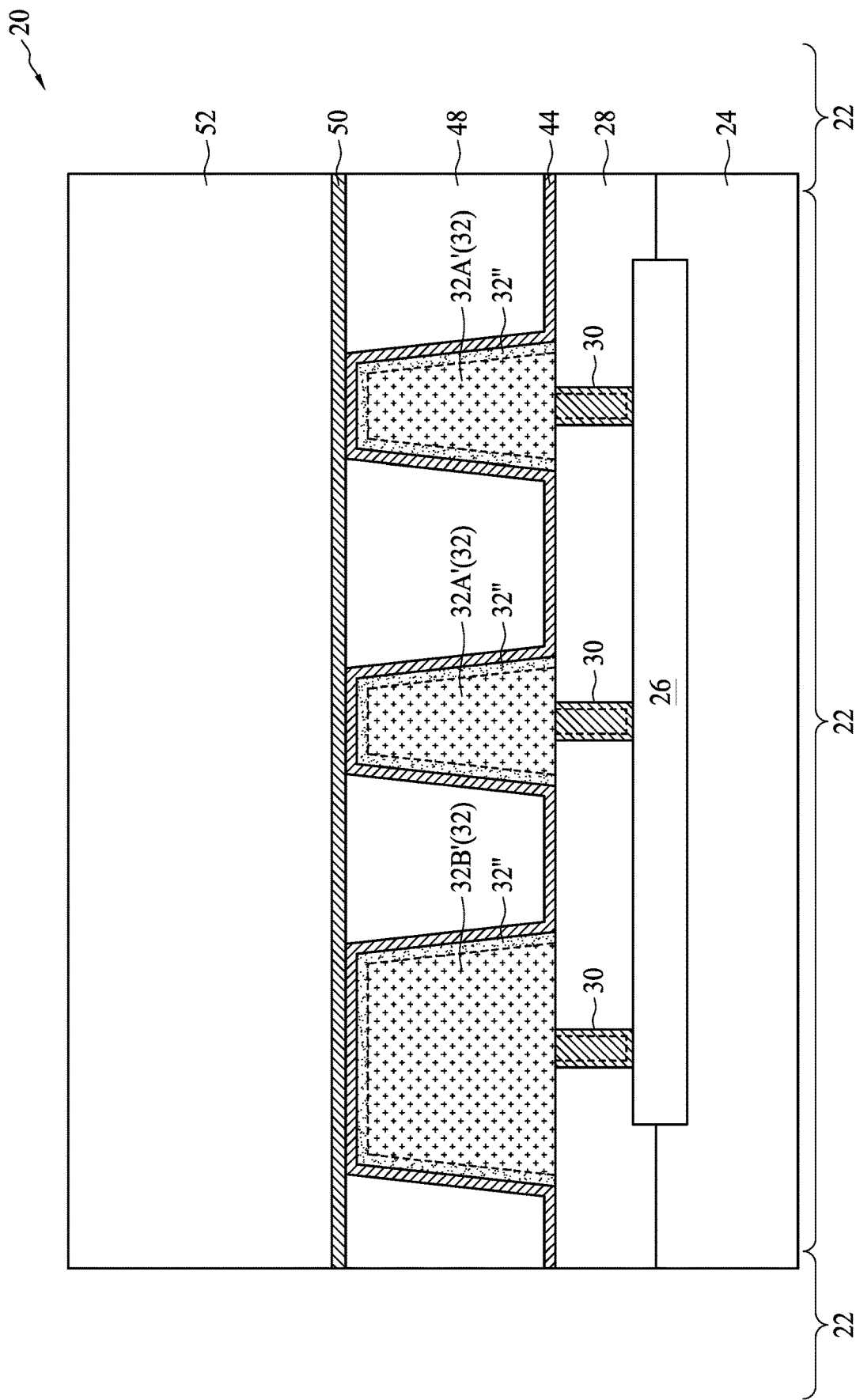

FIG. 10 illustrates the deposition of etch stop layer 50. The respective process is illustrated as process 220 in the process flow 200 as shown in FIG. 23. In accordance with some embodiments, etch stop layer 50 is formed of a material selected from SiN, SiC, SiON, SiOC, SiCN, or combinations thereof. Etch stop layer 50 may also include a metal oxide, a metal nitride, or the like. Etch stop layer 50 may be a single layer formed of a homogeneous material, or may be a composite layer including a plurality of dielectric sub-layers. In accordance with some embodiments of the present disclosure, etch stop layer 50 includes an aluminum nitride layer, a SiOC layer over the aluminum nitride layer, and an aluminum oxide layer over the SiOC layer.

Further referring to FIG. 10, dielectric layer 52 is deposited. The respective process is illustrated as process 222 in the process flow 200 as shown in FIG. 23. In accordance with some embodiments, dielectric layer 52 may be an ILD layer or an IMD layer, and hence may be formed of or comprises silicon oxide, PSG, BSG, BPSG, FSG, a carbon-containing low-k dielectric material, HSQ, MSQ, or the like. In accordance with some embodiments of the present disclosure, dielectric layer 52 may be formed of or comprises a low-k dielectric material having a dielectric constant lower than 3.8, and the dielectric constant may be lower than about 3.0. Dielectric layer 52 may also be porous.

Figure 11:
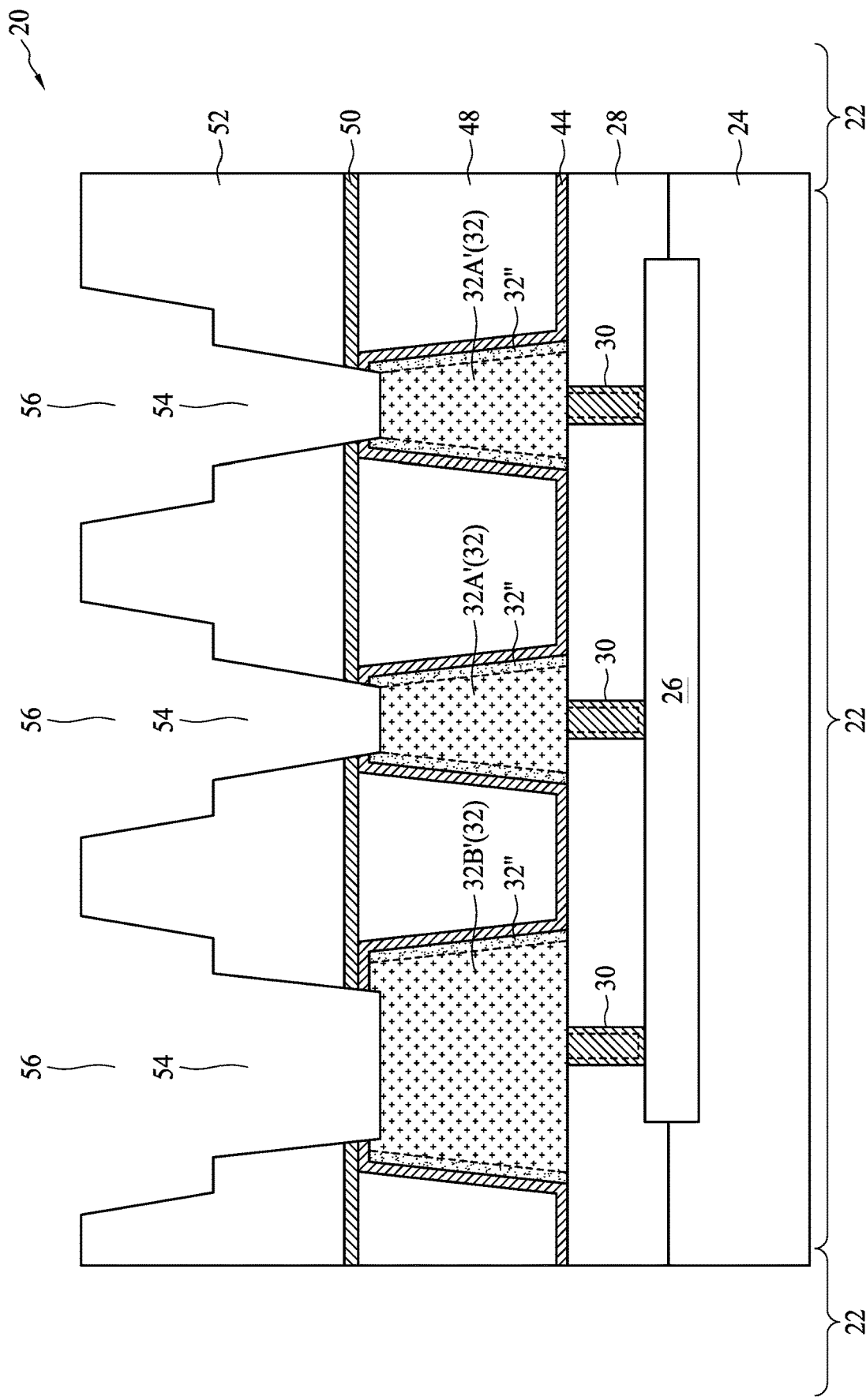

Referring to FIG. 11, trenches 56 and via openings 54 are formed in dielectric layer 52. The respective process is illustrated as process 224 in the process flow 200 as shown in FIG. 23. In accordance with some embodiments of the present disclosure, a metal hard mask (not shown) is formed and patterned to define the patterns of trenches 56. A photo lithography process is performed to etching dielectric layer 52 in order to form via openings 54. The via openings extends from the top surface of dielectric layer 52 to an intermediate level between the top surface and the bottom surface of dielectric layer 52. An anisotropic etching process is then performed to etch dielectric layer 52 and to form trenches 56 using the metal hard mask as an etching mask. At the same time trenches 56 are formed, the via openings extend downwardly, hence forming via openings 54. The etching for forming trenches 56 may be performed using a time-mode. In accordance with alternative embodiments, via openings 54 and trenches 56 are formed in separate photo lithography processes. For example, in a first photo lithography process, via openings 54 are formed extending down to reach etch stop layer 50. In a second lithography process, trenches 56 are formed.

Next, etch stop layer 50 is etched. The etching may be performed through a dry etching process or a wet etching process. Next, dielectric spacer layer 44 is etched-through, exposing the underlying surface layers 32" or graphite conductive features 32A' and graphite seal ring 32B'. In accordance with some embodiments, via openings 54 stops on the top surfaces of surface layers 32" when surface layers 32" are electrically conductive. In accordance with alternative embodiments (when surface layer 32" is electrically conductive or electrically insulating), via openings 54 may penetrate through surface layer 32", so that the inner portions of graphite conductive features 32A' and graphite seal ring 32B' are exposed, which inner portions are crystalline graphene layers.

Referring to FIG. 12, barrier layer 58 is deposited. In accordance with some embodiments, barrier layer 58 is formed of or comprises titanium, titanium nitride, tantalum, tantalum nitride, or the like. Barrier layer 58 may be formed as a conformal layer, which may be formed using CVD, ALD, PVD, or the like. After the formation of barrier layer

58, a metal seed layer (not shown) is formed. The metal seed layer may be formed of or comprise copper, and may be formed, for example, using PVD.

FIG. 12 further illustrates the deposition of conductive material 60. In accordance with some embodiments, conductive material 60 comprises copper or a copper alloy, cobalt, tungsten, aluminum, or the like, or alloys thereof. The deposition process may include Electro Chemical Plating (ECP), electroless plating, CVD, or the like. Conductive material 60 fully fills via openings 54 and trenches 56. Next, a planarization process such as a CMP process or a mechanical grinding process is performed to remove excess portions of the conductive material 60 and barrier layer 58. The planarization process may be stopped on the top surface of dielectric layer 52. The remaining portions of conductive material 60 and barrier layer 58 form vias 62 and metal lines 64. The respective process is illustrated as process 226 in the process flow 200 as shown in FIG. 23. Metal lines 64 include metal lines 64A and seal ring 64B. Vias 62 include metal vias 62A and seal ring 62B. Vias 62, metal lines 64, graphite conductive features 32A', and conductive features 30 form parts of interconnect structure 66.

In the example embodiments as shown in FIGS. 11 and 12, a dual damascene structure is formed. In accordance with alternative embodiments, single damascene processes may be performed, and metal vias, metal lines, or metal contact plugs are formed over and contacting graphite conductive features 32A' and graphite seal ring 32B'. In accordance with these embodiments, the top widths of graphite conductive features 32A' may be larger than the bottom widths of the corresponding overlying single damascene structure. In accordance with yet alternative embodiments, graphite may be used to form more conductive features over and contacting graphite conductive features 32A' and graphite seal ring 32B'. The materials and the formation processes may be essentially the same as provided above.

In subsequent processes, more conductive features are formed over metal lines 64 to form more layers for interconnect structure 66. Since upper conductive layers may have greater pitches and widths than the underlying layers, lower layers of the interconnect structure may be formed using graphite, while upper layers of the interconnect structure may be formed using damascene processes. There may be a dividing layer, for example, layer M0, M1, or M2, and the layers over and including the dividing layer are free from graphite, and all graphite-containing layers are underlying the dividing layer. When more layers are formed for interconnect structure 66, seal rings are also formed over and electrically connected to the underlying seal rings 64B, 62B, and connect to the seal ring comprising graphite seal ring 32B' and the surrounding portion of dielectric spacer layer 44.

Figure 13:
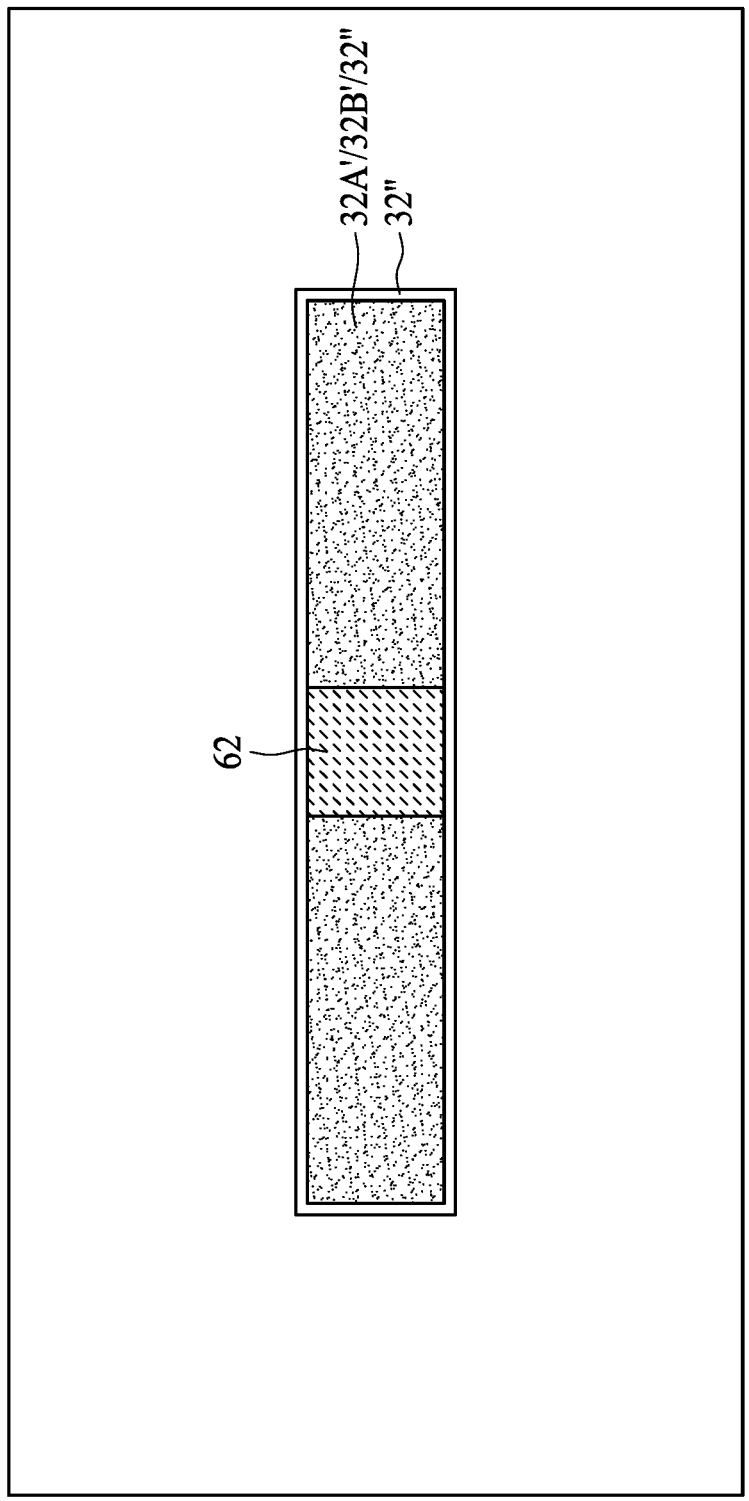
FIG. 13 illustrates a top view of a part of an interconnect structure comprising graphite in accordance with some embodiments.

FIG. 13 illustrates a top view of a part of graphite conductive features 32A' (or graphite seal ring 32B') and the corresponding surface layer 32" in accordance with some embodiments. Via 62 may penetrate through surface layer 32". Furthermore, surface layer 32" may form a ring encircling the inner portion of the corresponding graphite conductive features 32A' and graphite seal ring 32B'.

Figure 14:
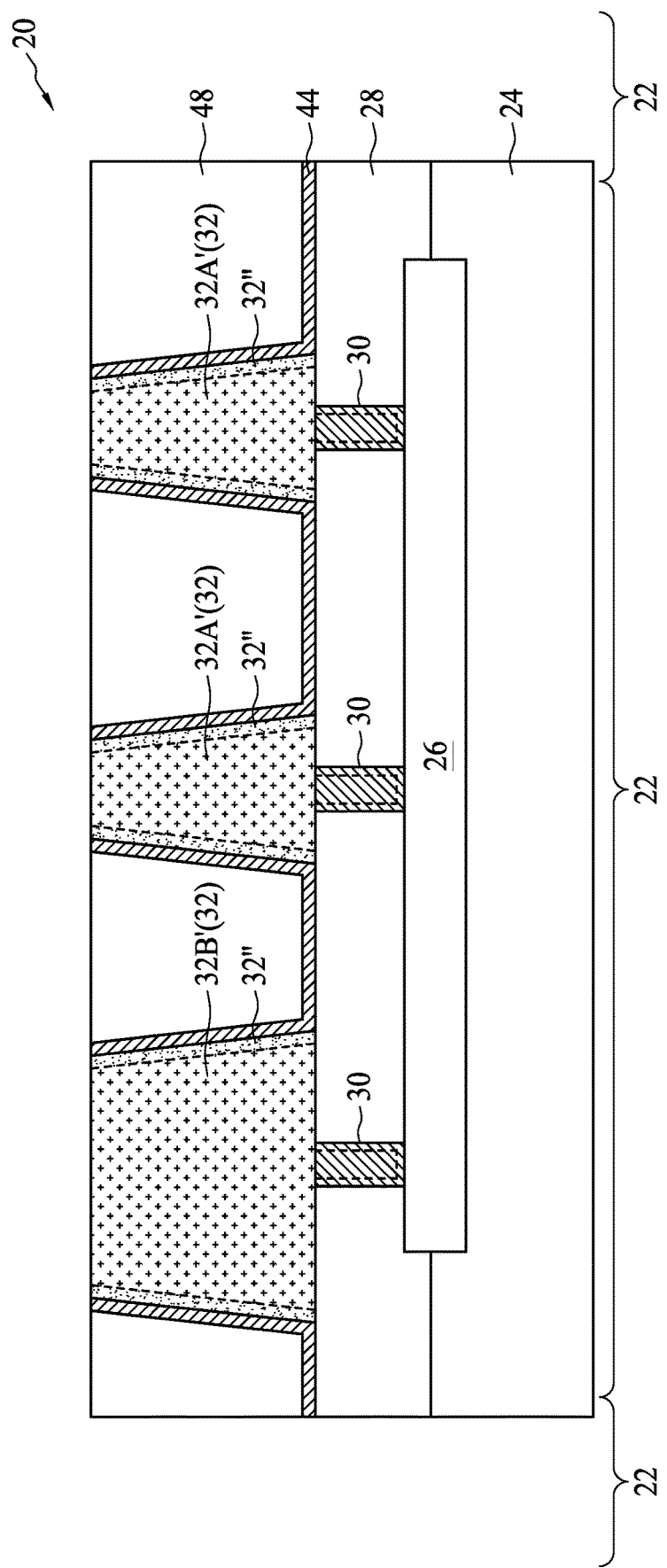
FIGS. 14-16 illustrate the cross-sectional views of intermediate stages in the formation of an interconnect structure comprising graphite in accordance with some embodiments.
Figure 15:
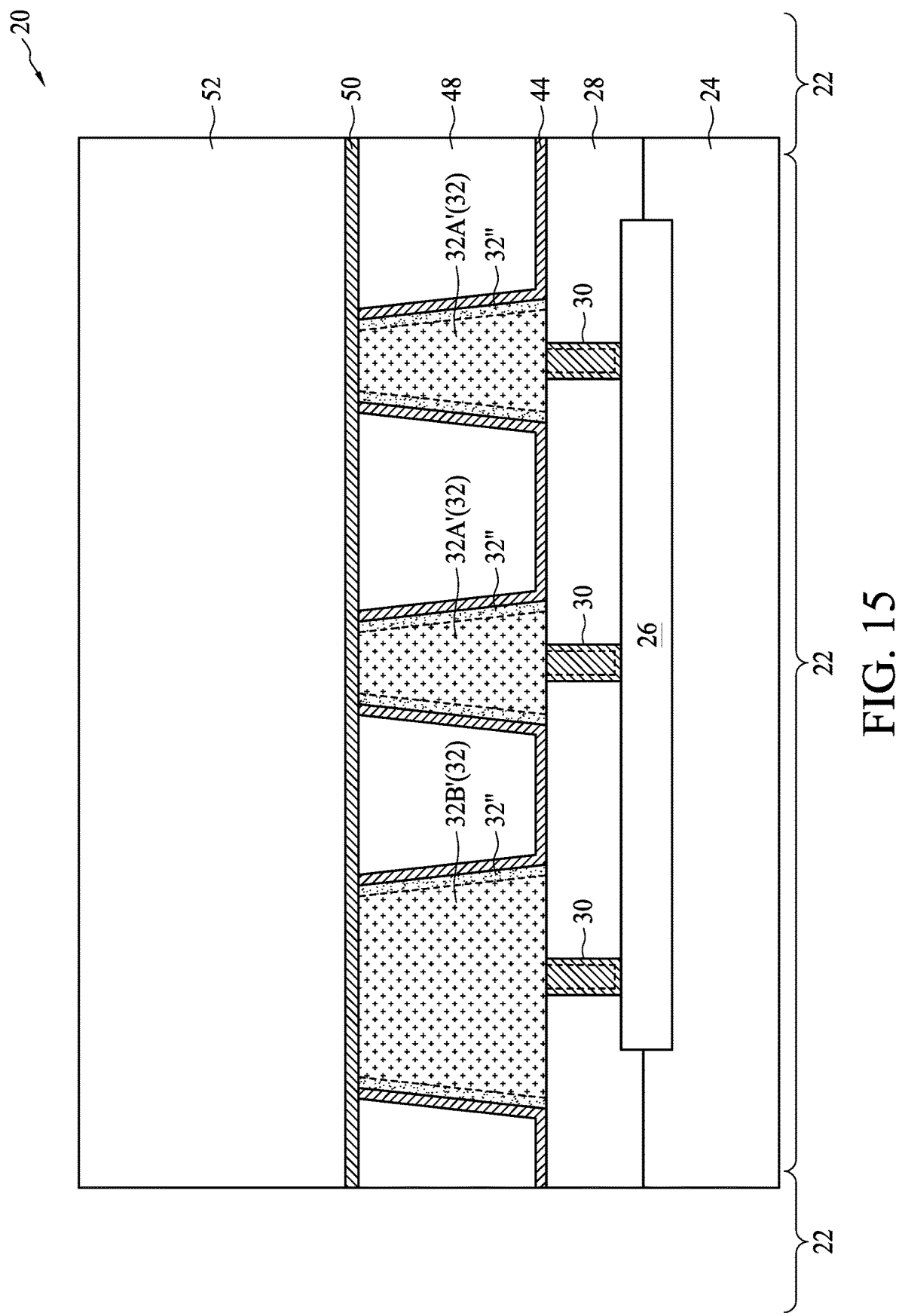

FIGS. 14 through 16 illustrate cross-sectional views of intermediate stages in the formation of a graphite-containing interconnect structure in accordance with alternative embodiments of the present disclosure. These embodiments are similar to the embodiments shown in FIGS. 1 through 12, except that in the planarization of dielectric layer 48, the top surface portions of dielectric spacer layer 44 is also removed. Unless specified otherwise, the materials and the formation processes of the components in these embodiments are essentially the same as the like components, which are denoted by like reference numerals in the preceding embodiments shown in FIGS. 1 through 12. The details regarding the formation process and the materials of the components shown in FIGS. 14 through 16 may thus be found in the discussion of the preceding embodiments.

The initial processes of these embodiments are essentially the same as shown in FIGS. 1 through 8, in which dielectric spacer layer 44 is formed to cover the sidewalls and the top surfaces of graphite conductive features 32A' and graphite seal ring 32B'. Surface layer 32" may be left unremoved, or may be removed using the plasma treatment. Dielectric layer 48 is also deposited. Next, as shown in FIG. 14, a planarization process is performed. The planarization process is performed until the horizontal portions of dielectric spacer layer 44 on the top of graphite conductive features 32A' and graphite seal ring 32B' are removed. In accordance with some embodiments, the horizontal portions of surface layer 32" on top of graphite conductive features 32A' and graphite seal ring 32B' are also removed. Accordingly, the top surfaces of the inner crystalline graphite portions are exposed. In accordance with alternative embodiments, the horizontal portions of surface layer 32" on top of graphite conductive features 32A' and graphite seal ring 32B' remain after the planarization process.

FIG. 15 illustrates the deposition of etch stop layer 50 and dielectric layer 52. Etch stop layer 50 may be in contact with the horizontal portions of surface layer 32" on top of graphite conductive features 32A' and graphite seal ring 32B'. Alternatively, etch stop layer 50 may be in contact with the top surfaces of the inner crystalline portions if the horizontal portions of surface layer 32" have been removed in the planarization process.

FIG. 16 illustrates the formation of vias 62 and metal lines 64. In accordance with some embodiments in which surface layer 32" have horizontal portions, vias 62 may land on the top surfaces of surface layer 32", or alternatively, penetrate through the horizontal portions of surface layer 32". In accordance with some embodiments in which surface layer 32" do not have horizontal portions or there are no surface layer 32", vias 62 land directly on the top surfaces of the inner crystalline portions of graphite conductive features 32A' and graphite seal ring 32B'.

Figure 17:
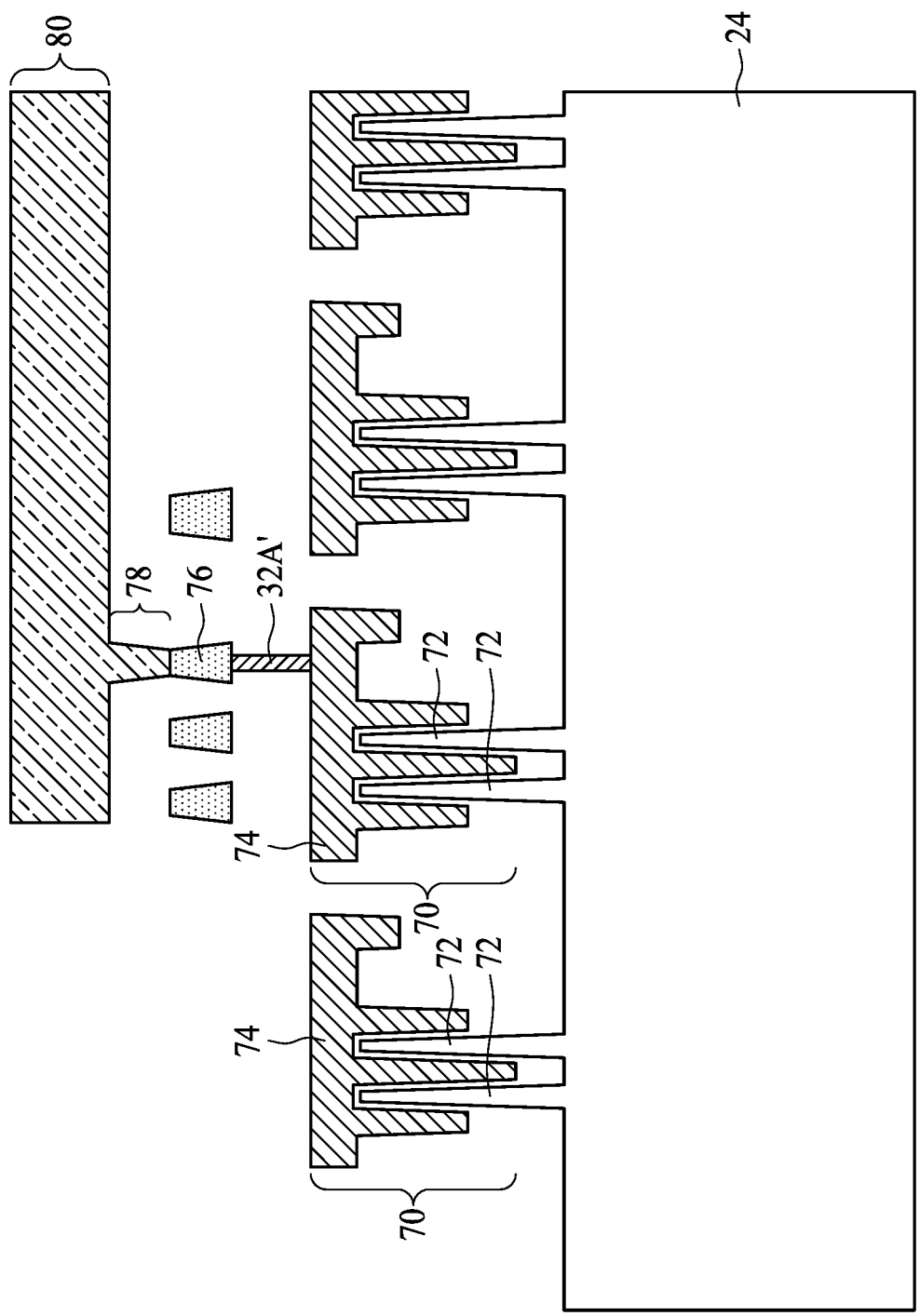
FIGS. 17, 18, and 19 illustrate the cross-sectional views of interconnect structures with each comprising one layer of graphite-comprising features in a Fin Field-Effect Transistor (FinFET), a nano-sheet transistor, a nanowire transistor, respectively, in accordance with some embodiments.
Figure 18:
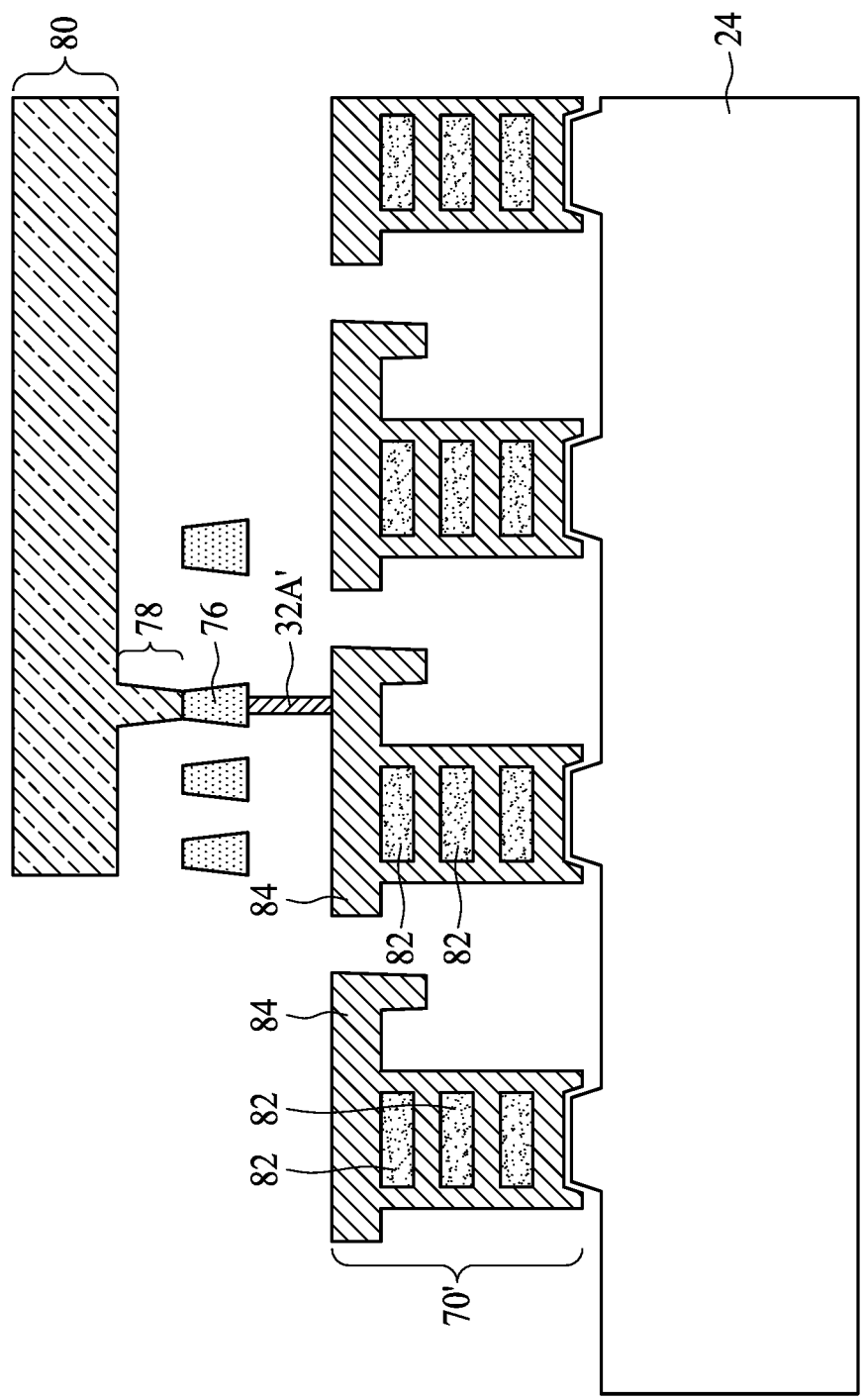
Figure 19:
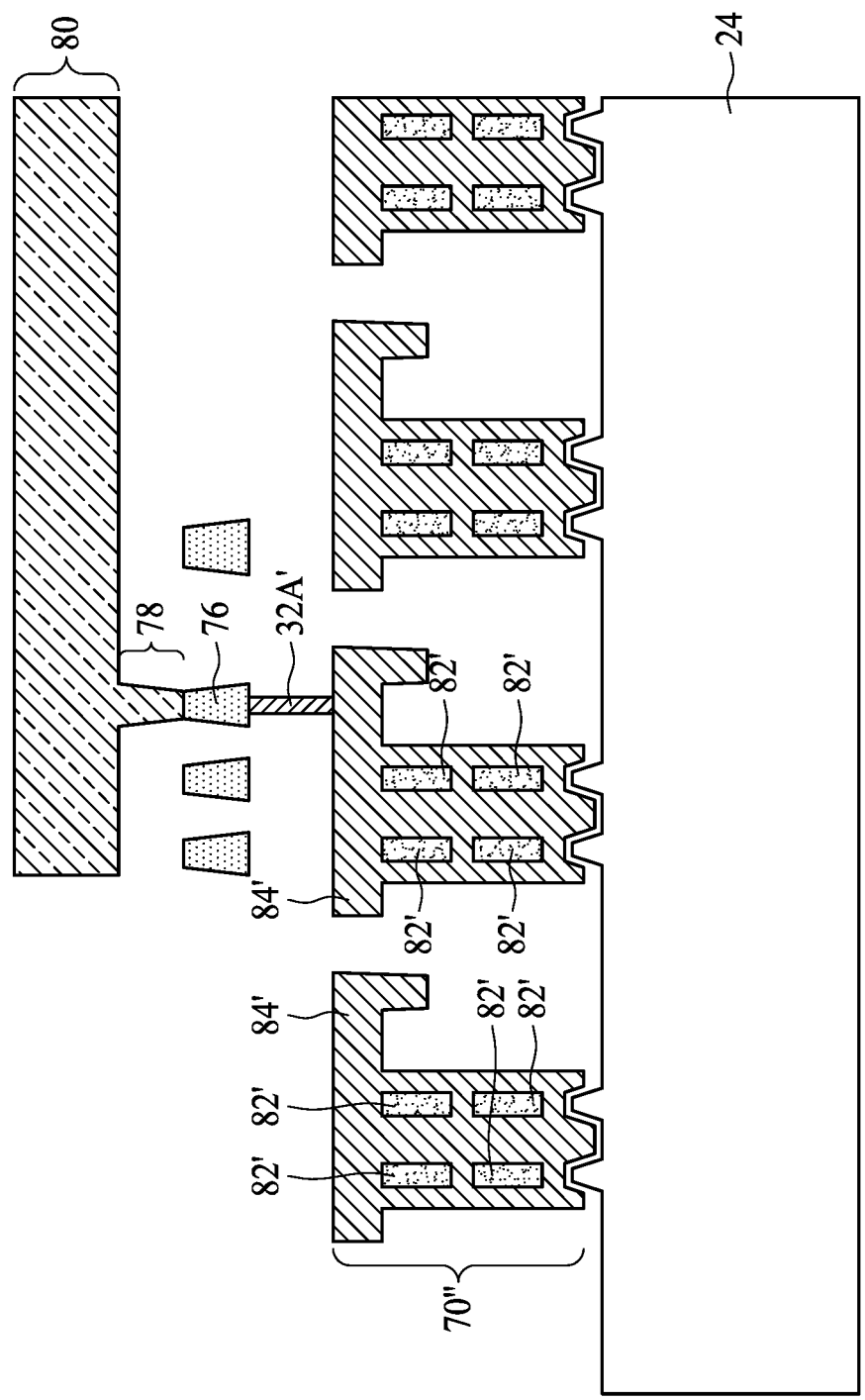

FIGS. 17 through 19 illustrate the use of the graphite conductive features 32A' in various types of transistors. The graphite seal ring 32B' may also be formed in these structures, although not illustrated. These figures are schematic, and the portions forming the channels of the transistors and the gate stacks are illustrated, while some other portions are not illustrated. Also, several layers of interconnect structures are illustrated.

FIG. 17 illustrates an interconnect structure connecting to a FinFET 70, which includes semiconductor fins 72, and gate stack 74 on the top surfaces and sidewalls of semiconductor fins 72. In accordance with some embodiments, graphite conductive feature 32A' is over and in direct contact with gate stack 74. In accordance with alternative embodiments, graphite conductive features 32A' may be over and in contact with contact plugs, vias, metal lines, or the like. FIG. 18 illustrates nano-sheet transistors 70', which include nano-sheets 82, and gate stacks 84 encircling nano-sheets 82. FIG. 19 illustrates nanowire transistors 70", which include nanowires 82', and gate stacks 84' encircling nanowires 82'. The gate stacks 74 (FIG. 17), 84 (FIG. 18), and 84' (FIG. 19) may include high-k gate dielectrics. In FIGS. 18 and 19, graphite conductive features 32A' may also be over and in direct contact with the corresponding gate stacks 84 and 84', respectively, or may be over and in contact with gate stacks, vias, metal lines, or the like.

Figure 20:
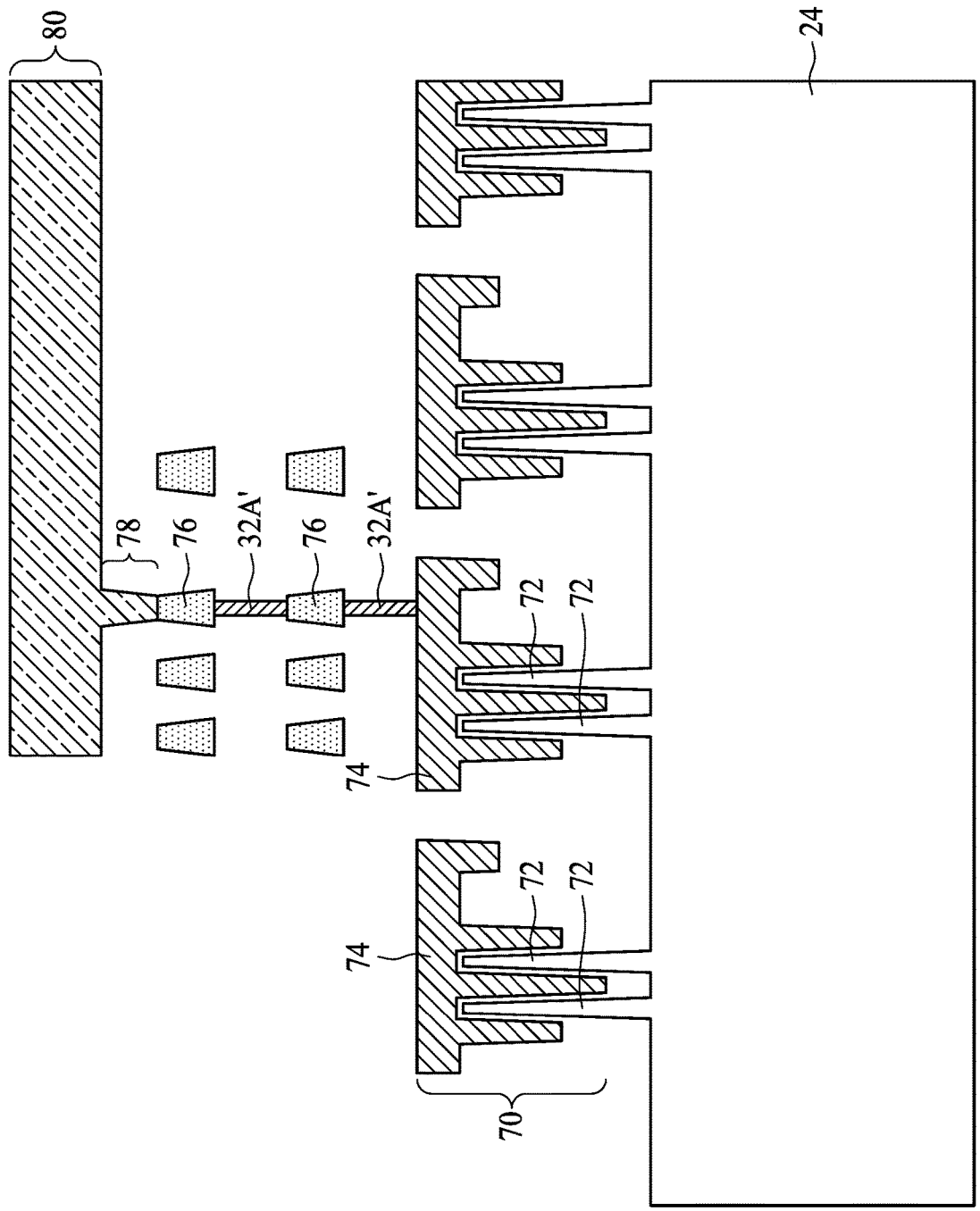
FIGS. 20, 21, and 22 illustrate the cross-sectional views of interconnect structures with each comprising two layers of graphite-comprising features in a Fin Field-Effect Transistor (FinFET), a nano-sheet transistor, a nanowire transistor, respectively, in accordance with some embodiments.
Figure 21:
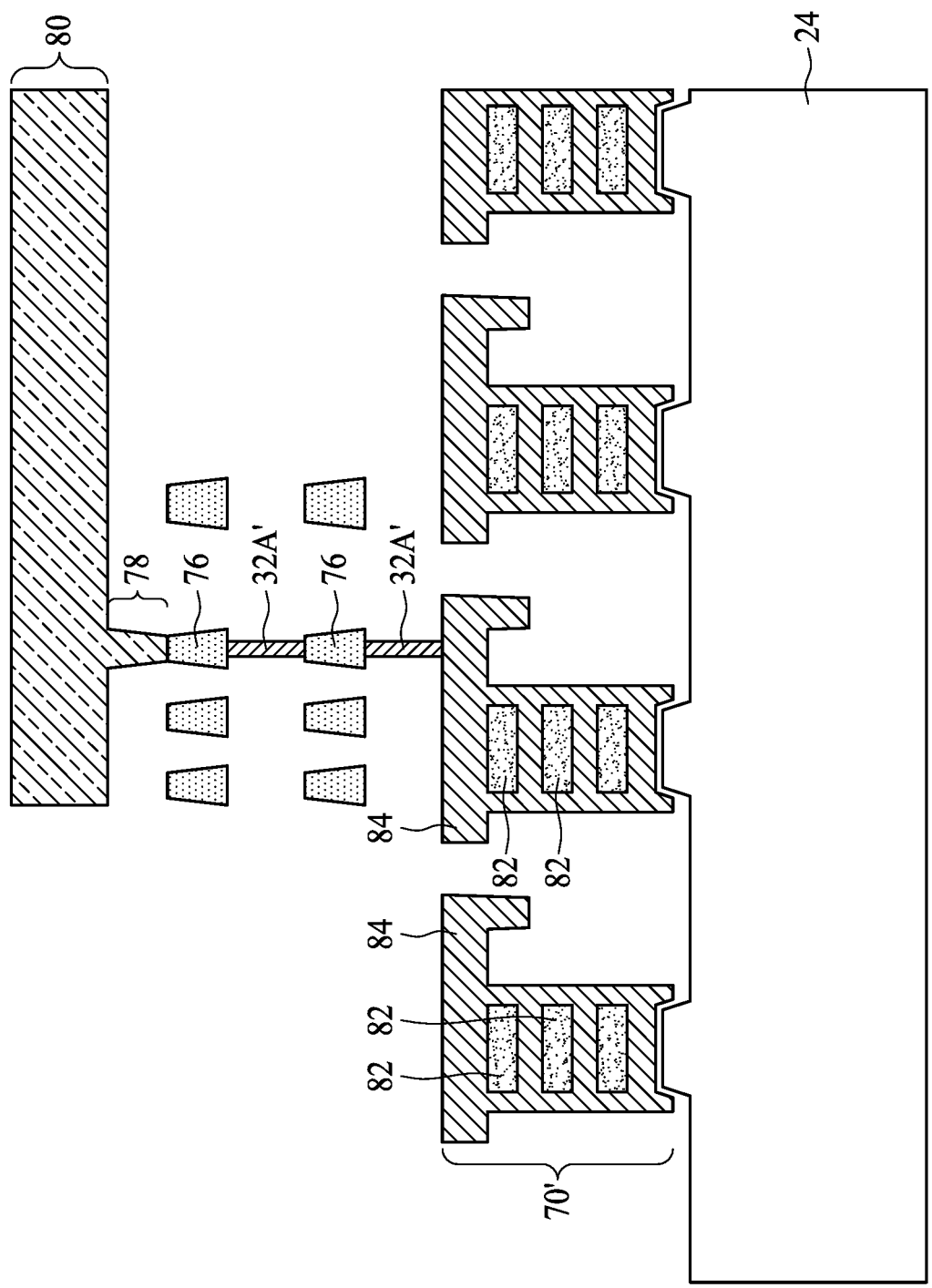
Figure 22:
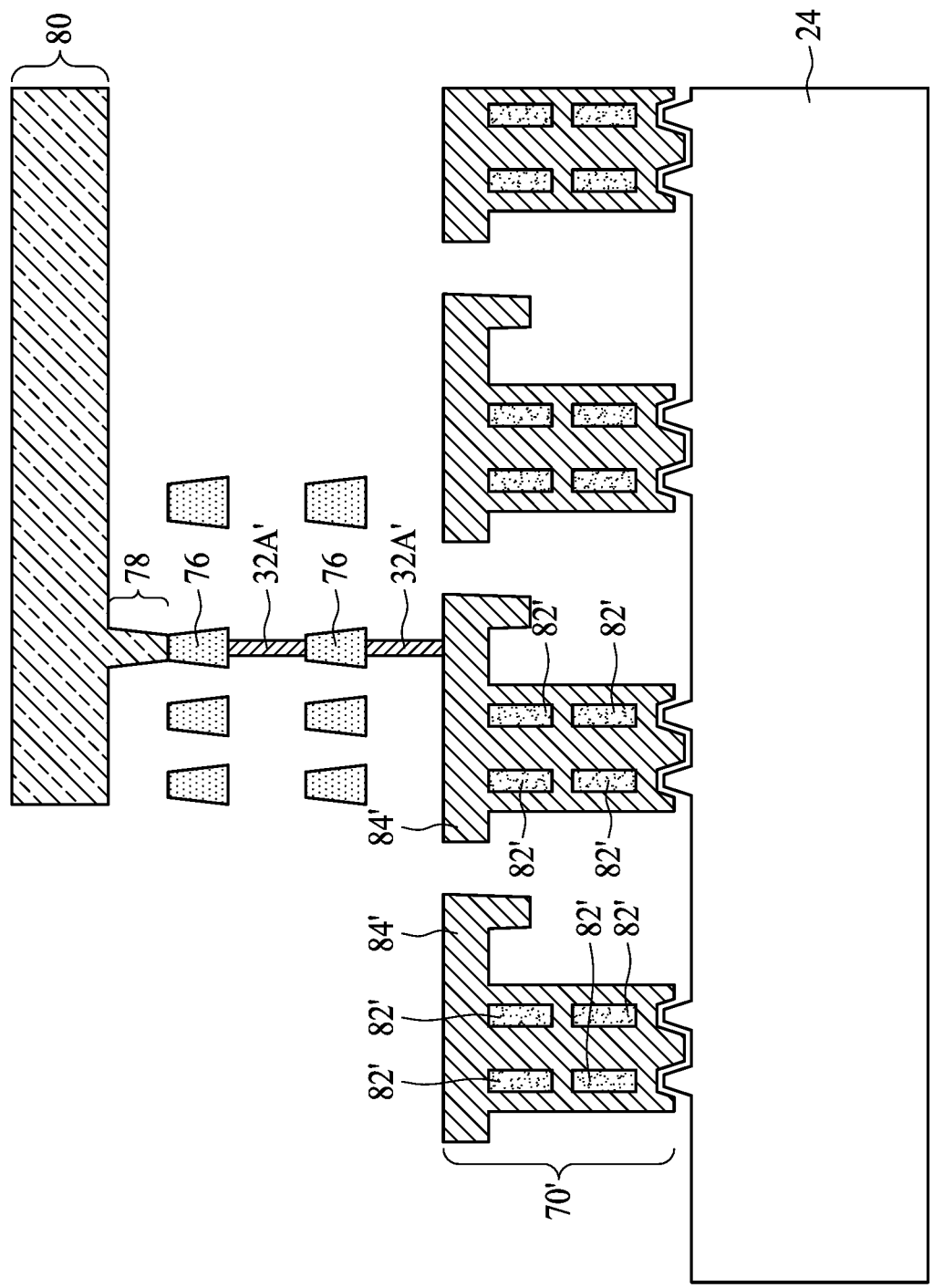

FIGS. 20, 21, and 22 illustrate the use of the graphite conductive features 32A' in various types of transistors. These embodiments are similar to the embodiments shown in FIGS. 17, 18, and 19, respectively, except that instead of having one layers of graphite conductive features 32A' shown, two layers of graphite conductive features 32A' are shown. The rest of the features are essentially the same as shown in FIGS. 17, 18, and 19, and are not repeated. These embodiments may be used when the upper layer of interconnect structure does not have adequate width to allow barrier layer, and hence graphite is used to form conductive features therein.

As shown in FIGS. 17 through 22, the lower layers of contact plugs, metal lines, vias, or the like may use graphite, so that the widths of the respective conductive features may be small. Since upper metal layers may have greater widths and greater spacings than the corresponding lower layers, starting from certain layer of interconnect structure and up, metal lines (for example, including barrier layers and copper) may be used, and there may not be any graphite feature in the upper layers.

The embodiments of the present disclosure have some advantageous features. Conventional conductive materials such as copper and aluminum may have their resistivity significant increased when the corresponding widths are smaller than 10 nm. Graphite, however, does not suffer from this effect. Accordingly, graphite is used to form narrow conductive features. In addition, graphite does not need diffusion barrier layer. The scaling of integrated circuits thus may advance into smaller dimensions.

In accordance with some embodiments of the present disclosure, a method comprises forming a first conductive feature; depositing a graphite layer over the first conductive feature; patterning the graphite layer to form a graphite conductive feature; depositing a dielectric spacer layer on the graphite layer; depositing a first dielectric layer over the dielectric spacer layer; planarizing the first dielectric layer; forming a second dielectric layer over the first dielectric layer; and forming a second conductive feature in the second dielectric layer, wherein the second conductive feature is over and electrically connected to the graphite conductive feature. In an embodiment, the planarizing the first dielectric layer stops on a top surface of a horizontal portion of the dielectric spacer layer, with the horizontal portion being overlapping the graphite conductive feature, and wherein the second conductive feature penetrates through the horizontal portion of the dielectric spacer layer. In an embodiment, in the planarizing, a horizontal portion of the dielectric spacer layer is removed, and wherein the horizontal portion overlaps the graphite conductive feature. In an embodiment, after the dielectric spacer layer is formed, a surface portion of the graphite conductive feature has been converted into an amorphous layer, and the dielectric spacer layer is deposited on the amorphous layer. In an embodiment, the planarizing the first dielectric layer stops on a top surface of a horizontal portion of the amorphous layer, with the horizontal portion being overlapping the graphite conductive feature. In an embodiment, in the planarizing, a horizontal portion of the amorphous layer is removed, with the horizontal portion being overlapping the graphite conductive feature. In an embodiment, the patterning the graphite layer further forms a graphite seal ring. In an embodiment, the method further comprises forming a conductive ring in the second dielectric layer, wherein the conductive ring is over and electrically connected to the graphite seal ring. In an embodiment, the depositing the graphite layer is performed using plasma enhanced chemical vapor deposition. In an embodiment, the second conductive feature is formed using a damascene process, and the second conductive feature comprises copper. In an embodiment, the method further comprises depositing an etch stop layer over the first dielectric layer and the graphite conductive feature, wherein the second dielectric layer is deposited over the etch stop layer.

In accordance with some embodiments of the present disclosure, a structure comprises a first conductive feature; a graphite conductive feature over and electrically coupling to the first conductive feature; a dielectric spacer layer comprising sidewall portions on sidewalls of the graphite conductive feature; a first dielectric layer encircling the sidewall portions of the dielectric spacer layer; an etch stop layer over the first dielectric layer and the graphite conductive feature; a second dielectric layer over the etch stop layer; and a second conductive feature penetrating through the second dielectric layer, wherein the second conductive feature is over and electrically connected to the graphite conductive feature. In an embodiment, the graphite conductive feature has a lateral dimension smaller than about 12 nm. In an embodiment, the dielectric spacer layer further comprises a horizontal portion overlapping the graphite conductive feature, and wherein the second conductive feature further penetrates through the horizontal portion of the dielectric spacer layer. In an embodiment, the structure further comprises an amorphous carbon layer over and contacting the graphite conductive feature, wherein the second conductive feature is over and contacts a top surface of the amorphous carbon layer. In an embodiment, the structure further comprises an amorphous carbon layer, wherein the second conductive feature penetrates through the amorphous carbon layer to contact a crystalline inner portion of the graphite conductive feature. In an embodiment, the amorphous carbon layer further comprises fluorine.

In accordance with some embodiments of the present disclosure, a structure comprises an integrated circuit; a dual damascene structure comprising a metal line and a via, wherein the dual damascene structure comprises a barrier layer and a copper region over the barrier layer; a graphite line electrically coupled between the via and the integrated circuit; and a dielectric spacer layer encircling the graphite line. In an embodiment, the graphite line has a top width and a bottom width greater than the top width. In an embodiment, the structure further comprises an amorphous carbon layer over and contacting the graphite line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
   forming a first conductive feature;

depositing a graphite layer over the first conductive feature;
patterning the graphite layer to form a graphite conductive feature;
depositing a dielectric spacer layer on the graphite layer;
depositing a first dielectric layer over the dielectric spacer layer;
planarizing the first dielectric layer, wherein the planarizing the first dielectric layer stops on a top surface of a horizontal portion of the dielectric spacer layer, with the horizontal portion being overlapping the graphite conductive feature;
forming a second dielectric layer over the first dielectric layer; and
forming a second conductive feature in the second dielectric layer, wherein the second conductive feature is over the graphite conductive feature and penetrates through the horizontal portion of the dielectric spacer layer to be electrically connected to the graphite conductive feature.

2. The method of claim 1, wherein after the dielectric spacer layer is formed, a surface portion of the graphite conductive feature has been converted into an amorphous layer, and the dielectric spacer layer is deposited on the amorphous layer.

3. The method of claim 2, wherein in the planarizing, a horizontal portion of the amorphous layer is removed, with the horizontal portion being overlapping the graphite conductive feature.

4. The method of claim 1, wherein the patterning the graphite layer further forms a graphite seal ring.

5. The method of claim 4 further comprising forming a conductive ring in the second dielectric layer, wherein the conductive ring is over and electrically connected to the graphite seal ring.

6. The method of claim 1, wherein the depositing the graphite layer is performed using plasma enhanced chemical vapor deposition.

7. The method of claim 1, wherein the second conductive feature is formed using a damascene process, and the second conductive feature comprises copper.

8. The method of claim 1 further comprising depositing an etch stop layer over the first dielectric layer and the graphite conductive feature, wherein the second dielectric layer is deposited over the etch stop layer.

9. A method comprising:
forming a graphite conductive feature over and electrically coupling to a first conductive feature;
forming a dielectric spacer layer, wherein the dielectric spacer layer comprises sidewall portions on sidewalls of the graphite conductive feature;
forming a first dielectric layer, wherein the sidewall portions of the dielectric spacer layer are in the first dielectric layer;
planarizing the first dielectric layer and the dielectric spacer layer to remove a horizontal portion of the dielectric spacer layer that overlaps the graphite conductive feature;
depositing an etch stop layer over the first dielectric layer and the graphite conductive feature;
depositing a second dielectric layer over the etch stop layer; and
forming a second conductive feature penetrating through the second dielectric layer, wherein the second conductive feature is over and electrically connected to the graphite conductive feature.

10. The method of claim 9, wherein the graphite conductive feature has a lateral dimension smaller than about 12 nm.

11. The method of claim 9, wherein the forming the dielectric spacer layer comprises a deposition process using a conformal deposition process.

12. The method of claim 9 further comprising forming an amorphous carbon layer over and contacting the graphite conductive feature, wherein the second conductive feature is over and contacts a top surface of the amorphous carbon layer.

13. The method of claim 9 further comprising forming an amorphous carbon layer, wherein the second conductive feature penetrates through the amorphous carbon layer to contact a crystalline inner portion of the graphite conductive feature.

14. The method of claim 13, wherein the amorphous carbon layer further comprises fluorine.

15. A method comprising:
forming an integrated circuit;
forming a dual damascene structure comprising:
a metal line and a via, wherein the dual damascene structure comprises a barrier layer and a copper region over the barrier layer;
forming a graphite line electrically coupled between the via and the integrated circuit; and
forming a dielectric spacer layer encircling the graphite line, wherein at a time after the dielectric spacer layer is formed, a surface portion of the graphite line has been converted into an amorphous layer, and the dielectric spacer layer is deposited on the amorphous layer.

16. The method of claim 15, wherein the graphite line has a top width and a bottom width, wherein the bottom width is greater than the top width.

17. The method of claim 12, wherein the amorphous carbon layer is formed by converting a surface layer of the graphite conductive feature to the amorphous carbon layer.

18. The method of claim 13, wherein the forming the amorphous carbon layer comprises converting a surface layer of the graphite conductive feature to the amorphous carbon layer.

19. The method of claim 15, wherein the dielectric spacer layer is deposited as a conformal layer comprising a horizontal portion overlapping the graphite line, and vertical portions on sidewalls of the graphite line.

20. The method of claim 12, wherein the graphite conductive feature has a top width and a bottom width, with the bottom width being greater than the top width.

* * * * *